(12) United States Patent
Blanksby et al.

(10) Patent No.: US 8,799,736 B2
(45) Date of Patent: *Aug. 5, 2014

(54) COMMUNICATION DEVICE ARCHITECTURE FOR IN-PLACE CONSTRUCTED LDPC (LOW DENSITY PARITY CHECK) CODE

(71) Applicant: Broadcom Corporation, Irvine, CA (US)

(72) Inventors: Andrew J. Blanksby, Lake Oswego, OR (US); Ba-Zhong Shen, Irvine, CA (US); Jason A. Trachewsky, Menlo Park, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/872,275

(22) Filed: Apr. 29, 2013

(65) Prior Publication Data

US 2013/0238953 A1    Sep. 12, 2013

Related U.S. Application Data

(63) Continuation of application No. 12/770,068, filed on Apr. 29, 2010, now Pat. No. 8,433,971.

(60) Provisional application No. 61/173,963, filed on Apr. 29, 2009, provisional application No. 61/176,601, filed on May 8, 2009, provisional application No. 61/218,415, filed on Jun. 19, 2009, provisional application No. 61/220,183, filed on Jun. 24, 2009.

(51) Int. Cl.
*H03M 13/00* (2006.01)

(52) U.S. Cl.
USPC ............................................ 714/752; 714/755

(58) Field of Classification Search
CPC .......... H03M 13/033; H03M 13/1134; H03M 13/1137; H03M 13/116; H03M 13/1185; H03M 13/1188; H03M 13/618; H03M 13/6362; H03M 13/6393; H03M 13/6502; H03M 13/6516; H03M 13/6527; H03M 13/1102; H04L 1/005; H04L 1/0057
See application file for complete search history.

(56) References Cited

U.S. PATENT DOCUMENTS 8,341,487 B2 * 12/2012 Blanksby et al. ............. 714/752
8,341,492 B2 * 12/2012 Shen et al. .................... 714/758
8,433,971 B2 * 4/2013 Blanksby et al. ............. 714/752

* cited by examiner

*Primary Examiner* — Guerrier Merant
(74) *Attorney, Agent, or Firm* — Garlick & Markison; Shayne X. Short

(57) ABSTRACT

Communication device architecture for in-place constructed LDPC (Low Density Parity Check) code. Intelligent design of LDPC codes having similar characteristics there between allows for a very efficient hardware implementation of a communication device that is operative to perform encoding of respective information bit groups using more than one type of LDPC codes. A switching module can select any one of the LDPC codes within an in-place LDPC code for use by an LDPC encoder circuitry to generate an LDPC coded signal. Depending on which sub-matrices of a superimposed LDPC matrix are enabled or disabled, one of the LDPC matrices from within an in-place LDPC code matrix set may be selected. A corresponding, respective generator matrix may be generated from each respective LDPC matrix. Selection among the various LDPC codes may be in accordance with a predetermined sequence, of based operating conditions of the communication device or communication system.

20 Claims, 36 Drawing Sheets

| | sub-matrix size: 42 (square) | sub-matrix size: 28 (square) | sub-matrix size: 21 (square) |
|---|---|---|---|
| max row weight | 16 | 24 | 32 |
| rate 1/2 | 8 × 16 | 12 × 24 | 16 × 32 |
| rate 2/3 or rate 5/8 | 6 × 16 | 8 × 24 | 12 × 32 |
| rate 3/4 | 4 × 16 | 6 × 24 | 8 × 32 |
| rate 5/6 or rate 13/16 | 3 × 16 | 4 × 24 | 6 × 32 |
| rate 7/8 | 2 × 16 | 3 × 24 | 4 × 32 |
| performance | best | better | |

600

NOTE: layers with column weight > 1 to meet a column weight ≥ 4 constraint

Fig. 8 (base code: rate 1/2 code with sub-matrix size 28)

Fig. 9 (from rate 1/2 code to rate 2/3 with sub-matrix size 28)

- compared to rate 1/2 code, upper 4 rows removed
- add additional elements to certain remaining columns (e.g., to maintain average column weight of 3-4)

Fig. 10 (from rate 1/2 code [or rate 2/3] to rate 3/4 with sub-matrix size 28)
- compared to rate 1/2 code, upper 6 rows removed
- compared to rate 2/3 code, upper 2 rows removed
- add additional elements to certain remaining columns (e.g., to maintain average column weight of 3-4)

Fig. 11 (from rate 1/2 code [or 2/3, 3/4] to rate 5/6 with sub-matrix size 28)

1100

- compared to rate 1/2 code, upper 8 rows removed
- compared to rate 2/3 code, upper 4 rows removed
- compared to rate 3/4 code, upper 2 rows removed
- add additional elements to certain remaining columns (e.g., to maintain average column weight of 3-4)

| | parallel decoder for re-use code set | parallel decoder for in-place code set | in-place decoder penalty (or gain) |
|---|---|---|---|
| layout utilization | 55% | 45% | 18% lower |
| relative layout area | 1.0 | 1.3 | 30% larger |
| layout clock frequency | 87 MHz | 92 MHz | 6% faster |
| max iterations in 225 ns | 19 | 20 | 5% more |

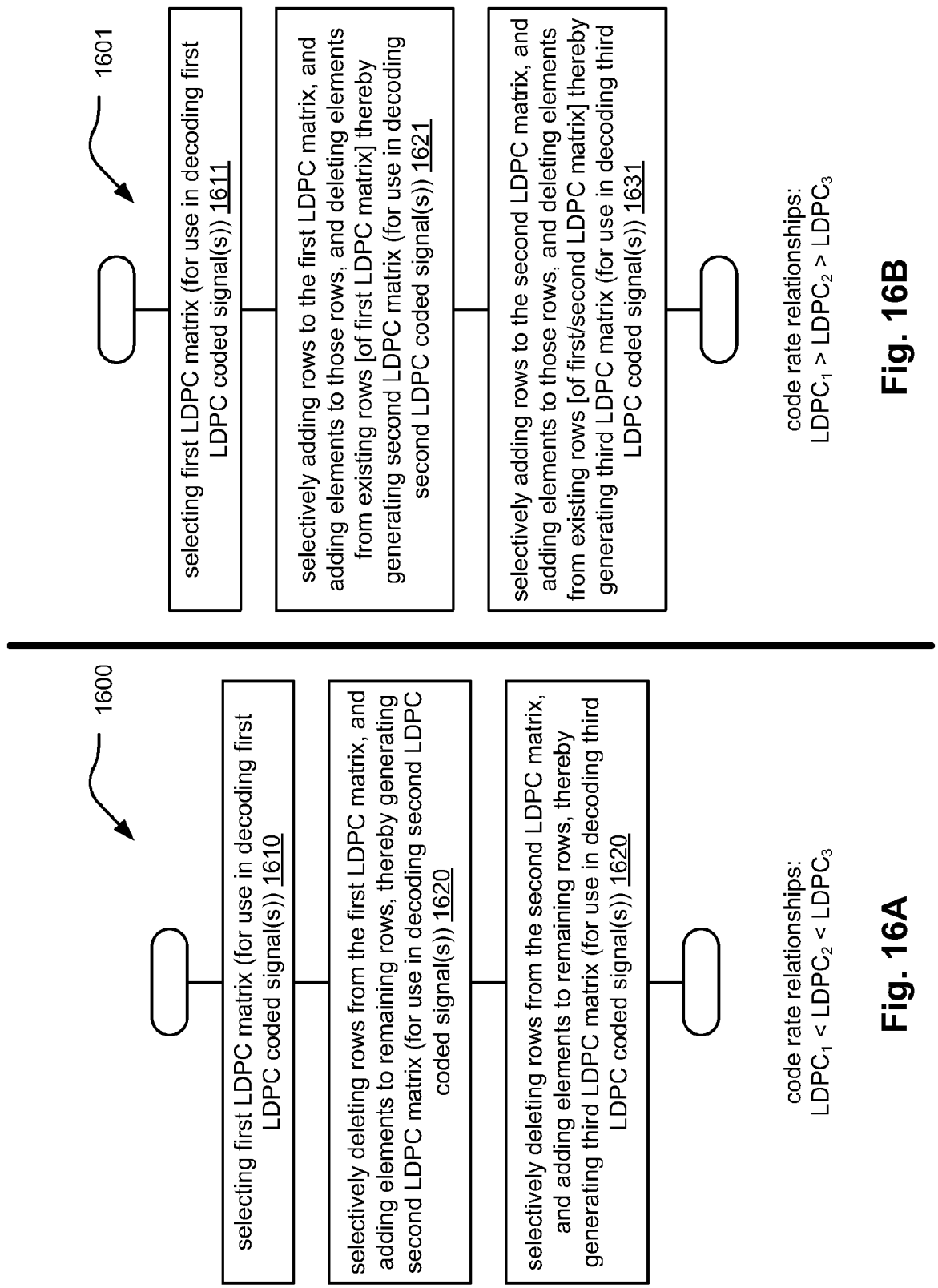

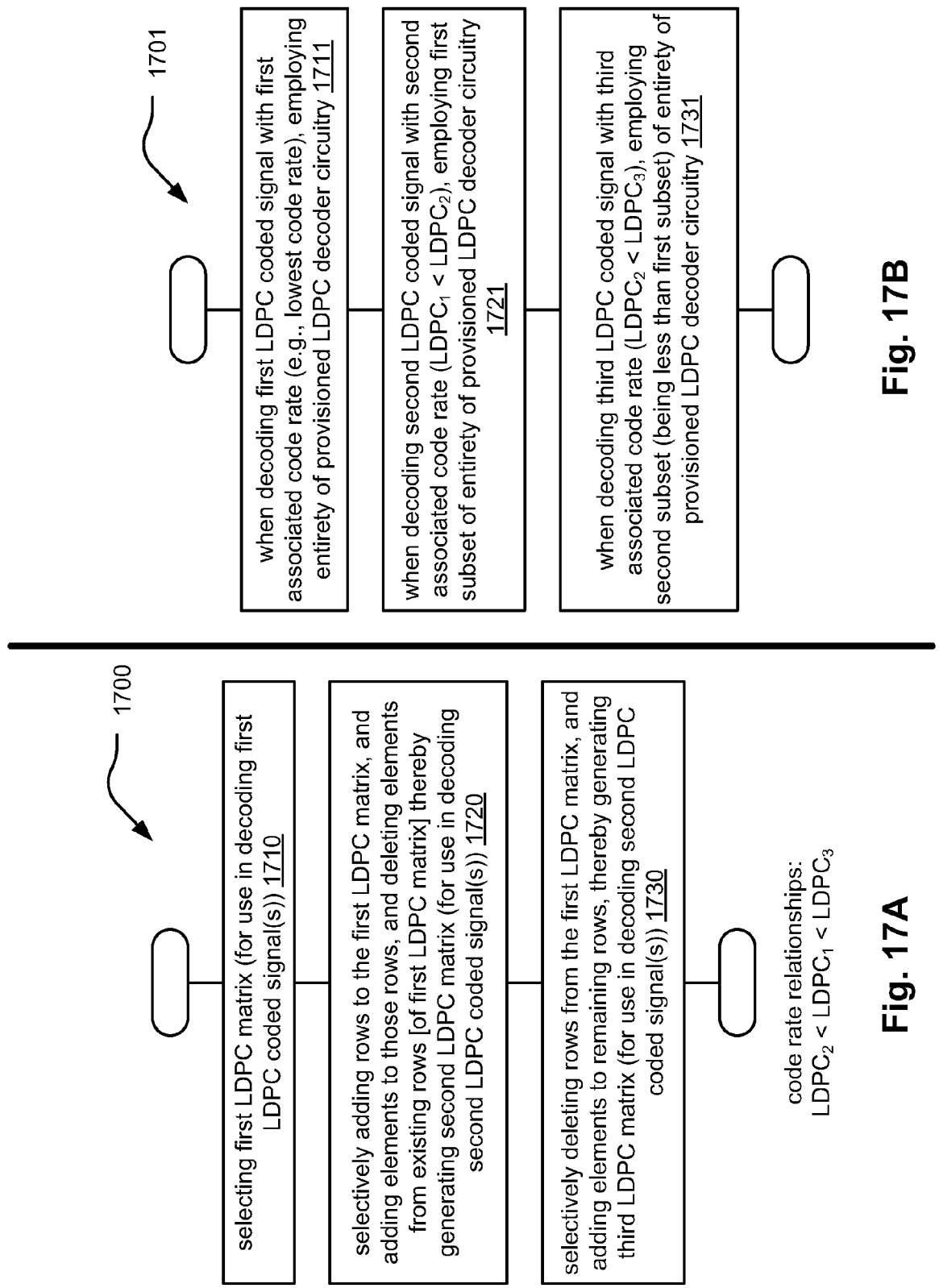

| row | | | | | | | | | | | | | | | | |
|---|---|---|---|---|---|---|---|---|---|---|---|---|---|---|---|---|
| 7 | 40 | -  | 38 | -  | 13 | -  | 5  | -  | 18 | -  | -  | -  | -  | -  | -  | -  |
| 6 | 34 | 36 | 35 | -  | 27 | -  | -  | 30 | 2  | 1  | -  | -  | -  | -  | -  | -  |
| 5 | -  | -  | -  | 31 | -  | 7  | -  | 34 | -  | 10 | 41 | -  | -  | -  | -  | -  |
| 4 | -  | 27 | -  | 18 | -  | 12 | 20 | -  | -  | -  | 15 | 6  | -  | -  | -  | -  |
| 3 | 35 | -  | 41 | -  | 40 | -  | 39 | -  | -  | -  | -  | 3  | 28 | -  | -  | -  |
| 2 | 29 | -  | 0  | -  | -  | 22 | -  | 4  | 28 | 28 | -  | -  | 24 | 23 | -  | -  |
| 1 | -  | 31 | -  | 23 | -  | 21 | -  | 20 | -  | -  | 12 | -  | -  | 0  | 13 | -  |
| 0 | -  | -  | 22 | -  | 34 | -  | 14 | -  | -  | -  | -  | 18 | -  | -  | 22 | 24 |

1800

Fig. 18 (base code: rate 1/2 code with sub-matrix size 42)

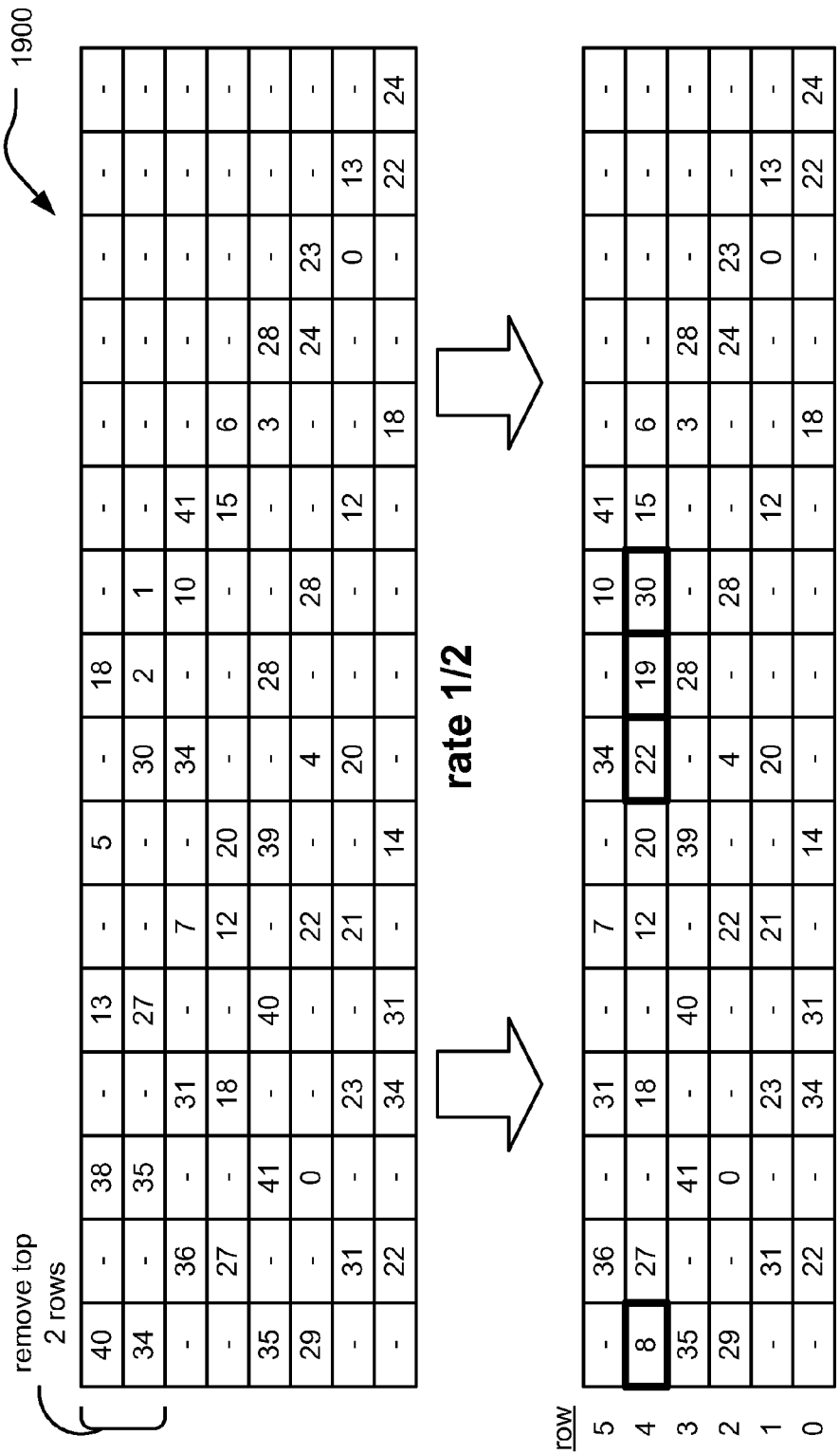
Fig. 19 (from rate 1/2 code to rate 5/8 code with sub-matrix size 42)

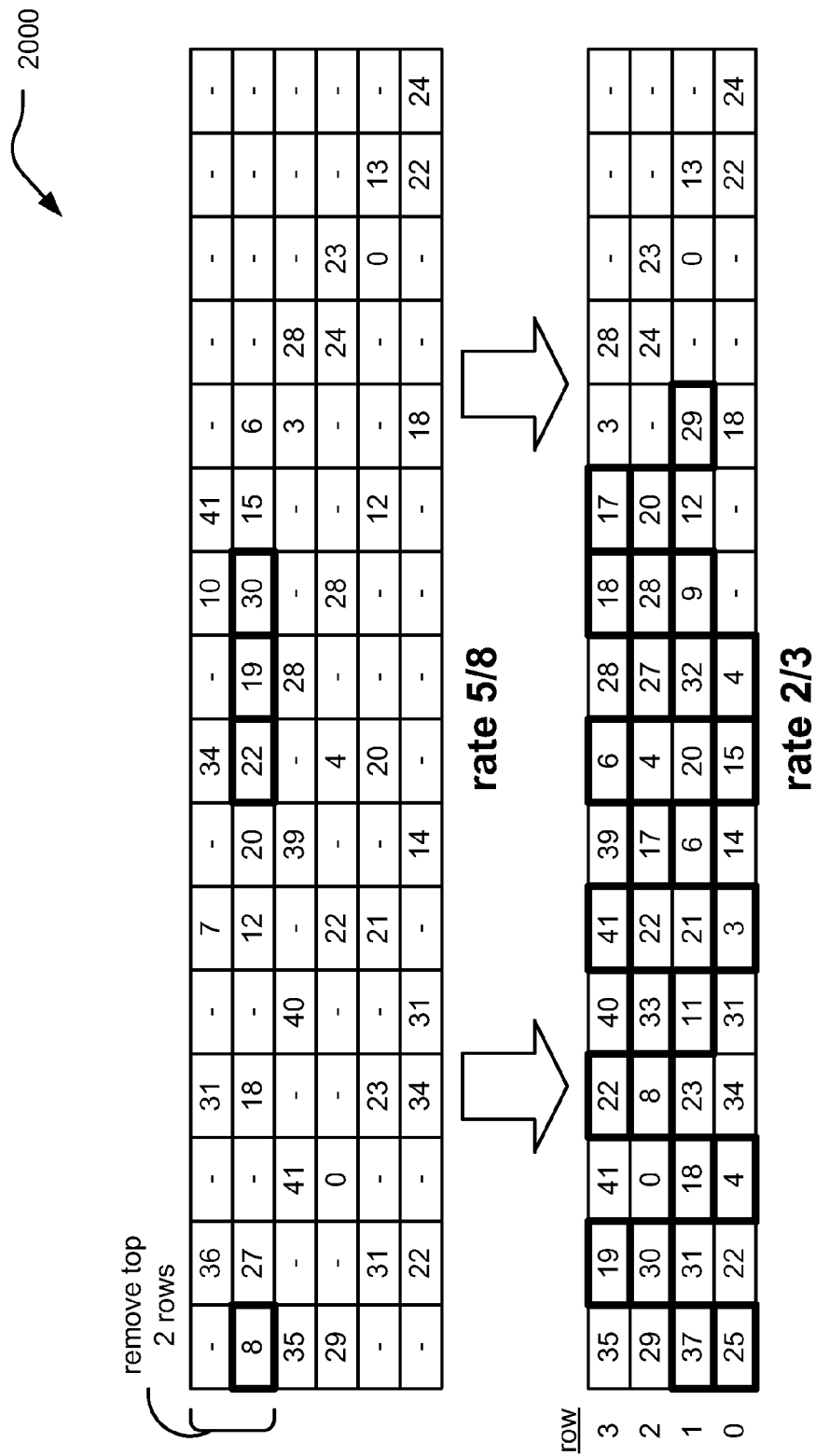
Fig. 20 (from rate 1/2 code [or 5/8] to rate 2/3 code with sub-matrix size 42)

Fig. 21 (from rate 1/2 code [or 5/8, 2/3] to rate 13/16 code with SMX size 42)
- compared to rate 2/3 code, upper/top row removed
- add some additional elements (e.g., 1 sub-matrix in top and middle rows, 4 sub-matrices in bottom row)

Fig. 23 (base code: rate 1/2 code with sub-matrix size 42)

| row \ layer | | | | | | | | | | | | | | 3 | 2 | 3 | 2 | 1 | 0 | 1 | 0 |
|---|---|---|---|---|---|---|---|---|---|---|---|---|---|---|---|---|---|---|---|---|
| 7 | 40 | - | - | - | 38 | - | 13 | - | 5 | 18 | - | - | - | - | - | - |
| 6 | 34 | - | 36 | - | 35 | - | 27 | - | - | 2 | 1 | - | - | - | - | - |
| 5 | - | - | - | 31 | - | - | - | 7 | - | - | 10 | 41 | - | - | - | - |
| 4 | - | 27 | - | 18 | - | - | 12 | - | 20 | - | - | 15 | 6 | 28 | - | - |
| 3 | 35 | - | 41 | - | - | 40 | - | - | 39 | 28 | - | - | 3 | - | - | - |
| 2 | 29 | - | 0 | - | - | - | 22 | - | - | - | 28 | - | 27 | - | 23 | - |
| 1 | - | 31 | - | 23 | - | - | 21 | - | - | - | - | 12 | - | - | 0 | 13 |
| 0 | - | 22 | - | 34 | - | - | 31 | - | 14 | 4 | - | - | - | 13 | 22 | 24 |

2300

- rate 1/2 LDPC code matrix: 336 rows × 672 columns, sub-matrix size 42 (42 × 42)

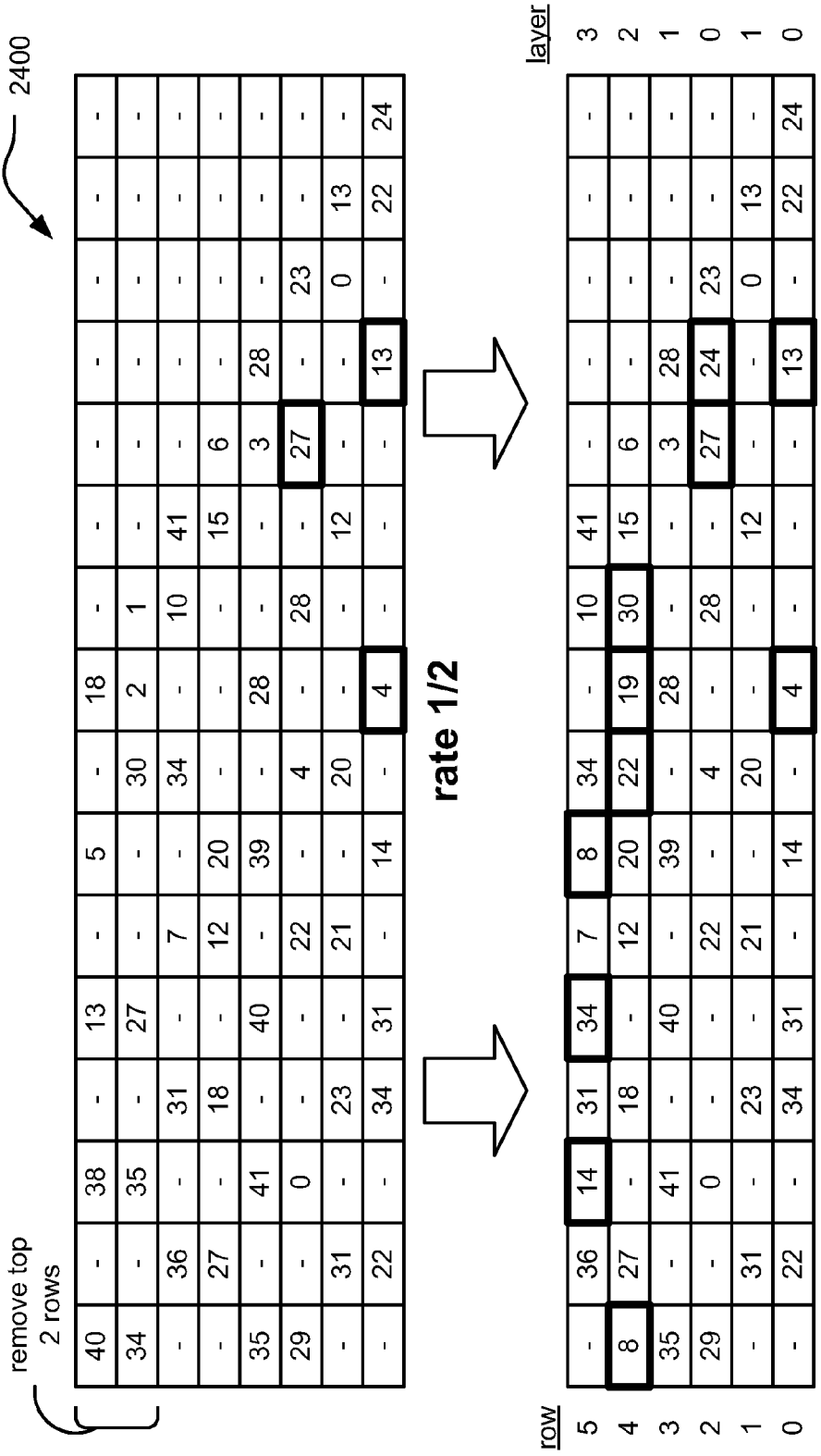
Fig. 24 (from rate 1/2 code to rate 5/8 code with sub-matrix size 42)

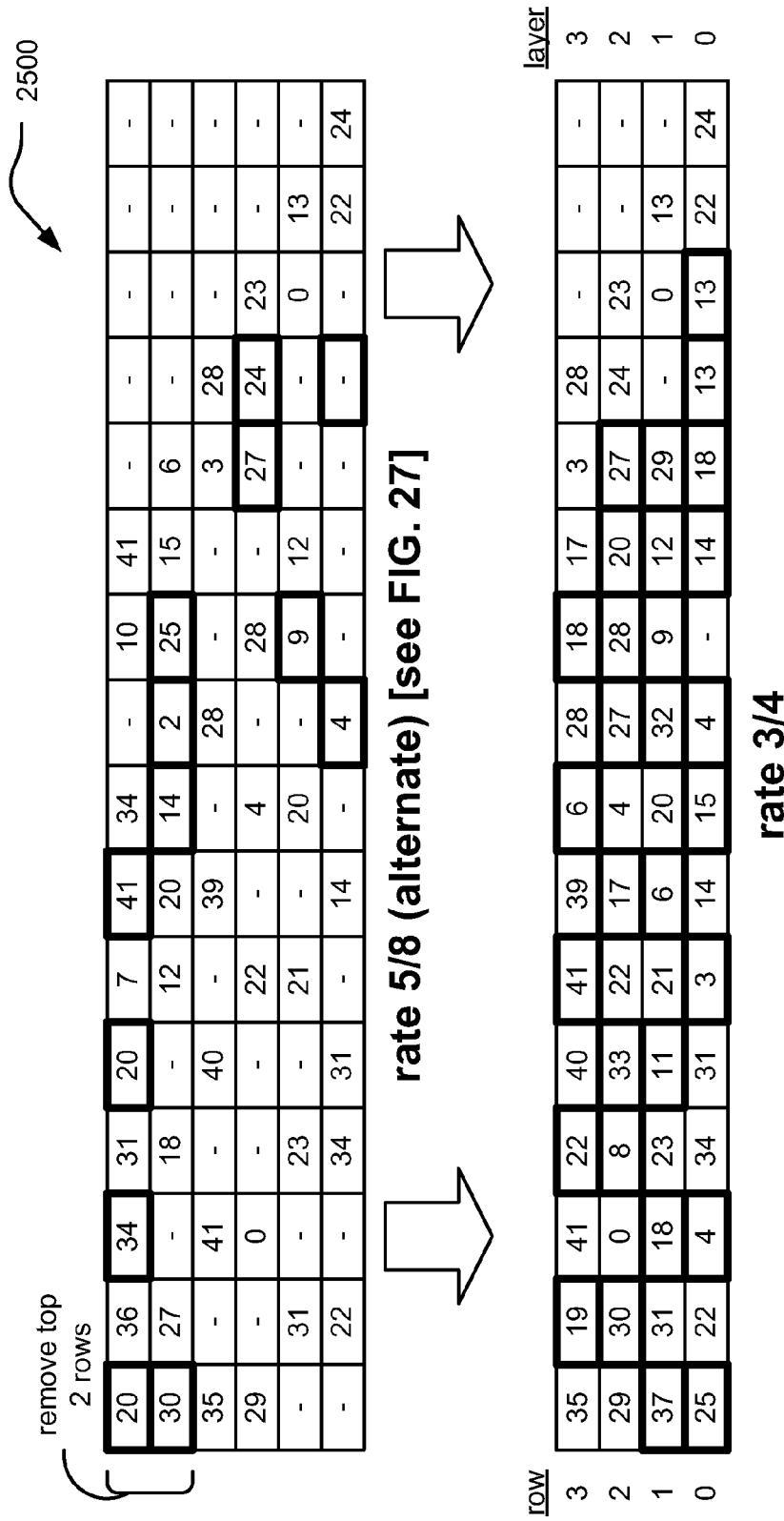
Fig. 25 (from rate 1/2 code [or 5/8] to rate 3/4 code with sub-matrix size 42)

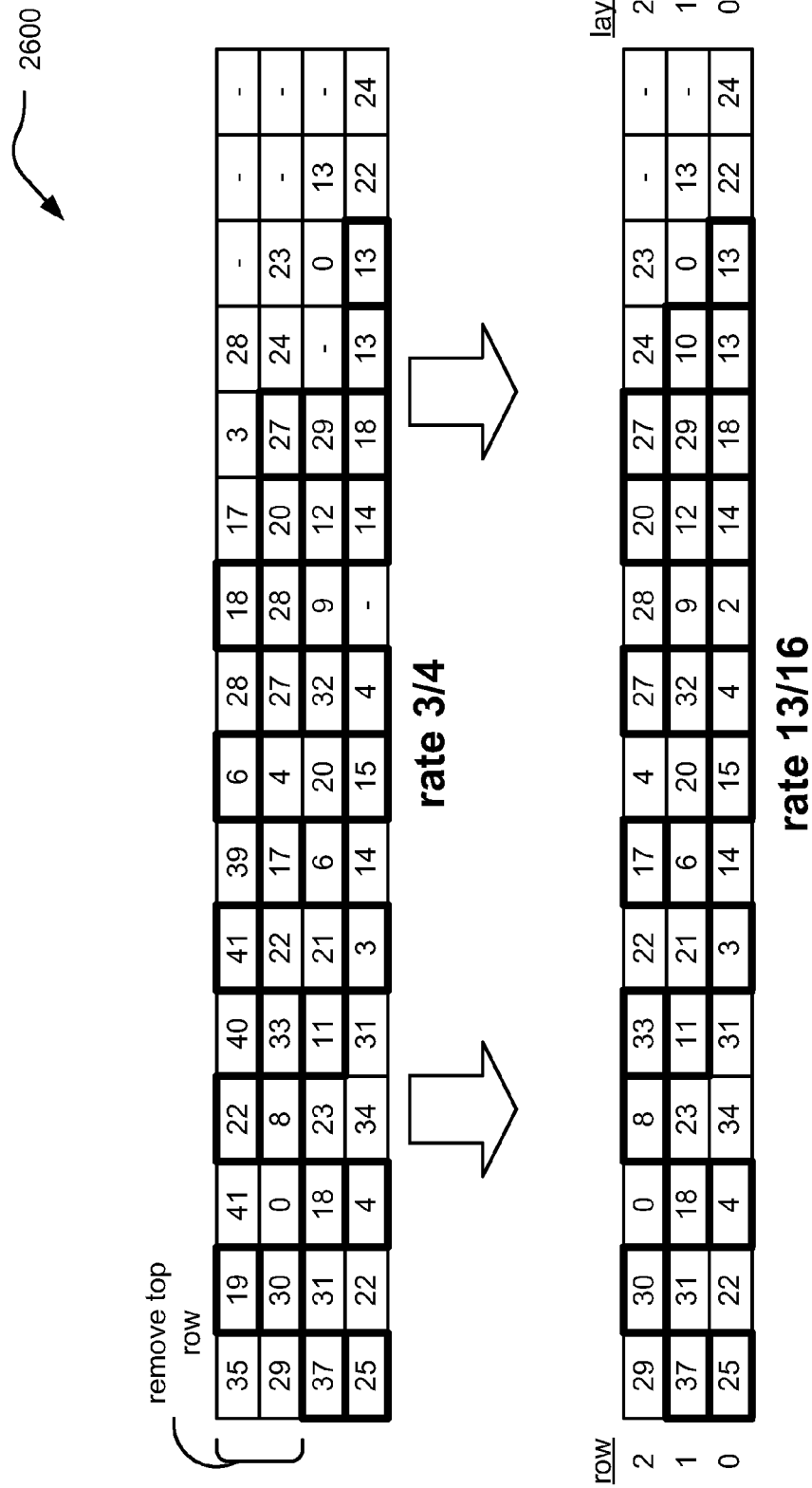
Fig. 26 (from rate 1/2 code [or 5/8, 3/4] to rate 13/16 code with SMX size 42)

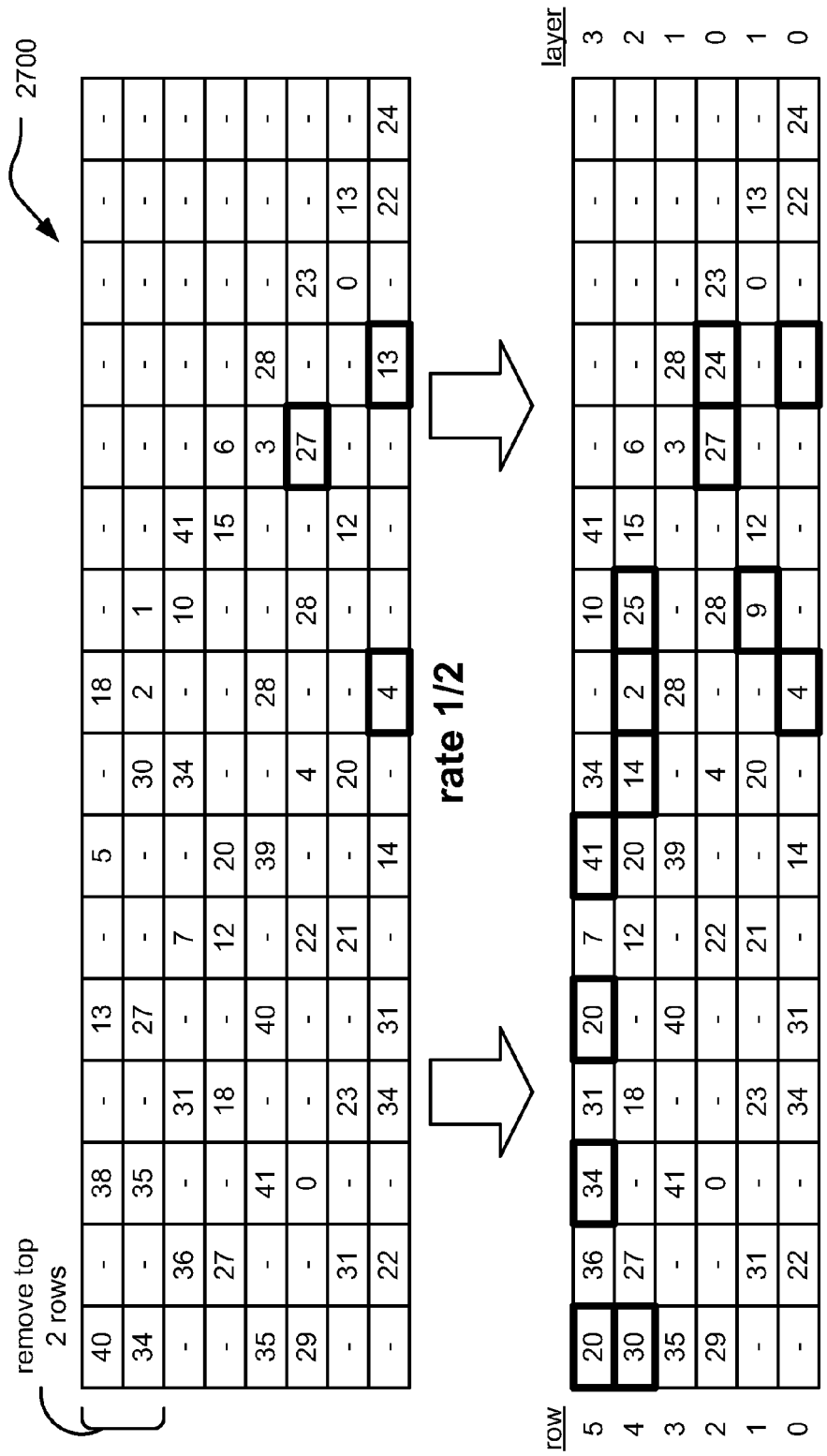
Fig. 27 (from rate 1/2 code to rate 5/8 code with sub-matrix size 42)

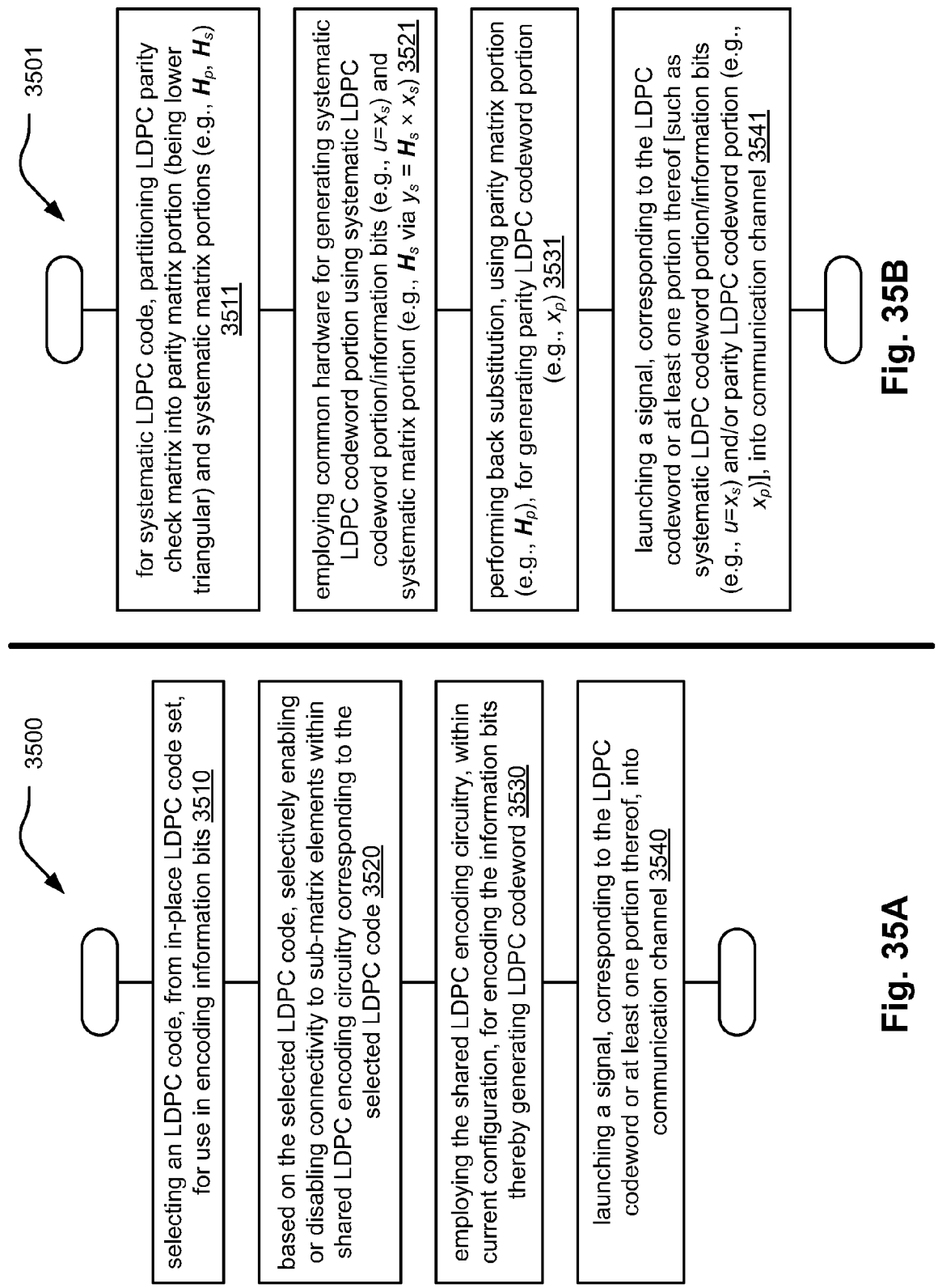

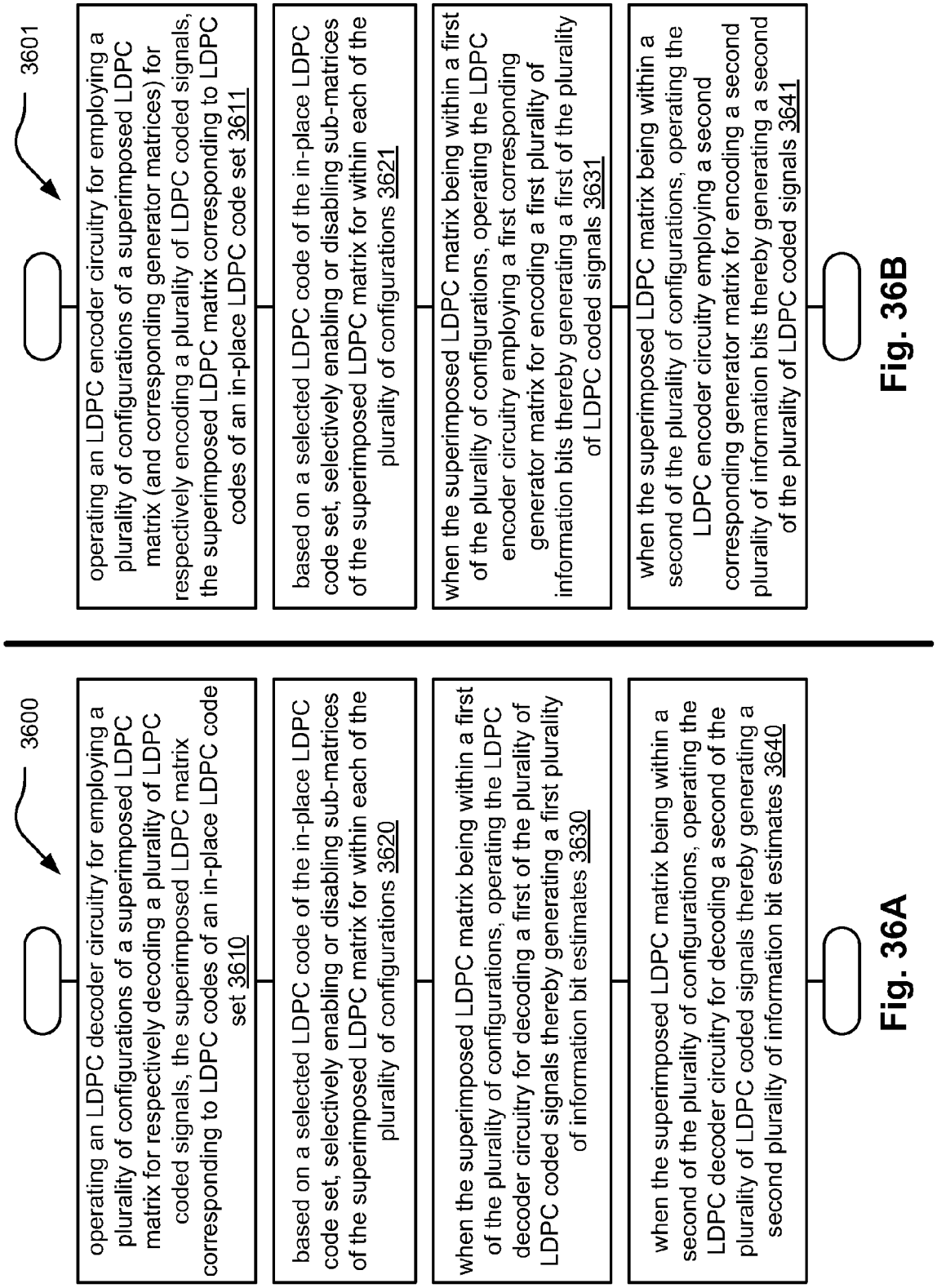

COMMUNICATION DEVICE ARCHITECTURE FOR IN-PLACE CONSTRUCTED LDPC (LOW DENSITY PARITY CHECK) CODE

CROSS REFERENCE TO RELATED PATENTS/PATENT APPLICATIONS

Continuation Priority Claim, 35 U.S.C. §120

The present U.S. Utility patent application claims priority pursuant to 35 U.S.C. §120, as a continuation, to the following U.S. Utility patent application which is hereby incorporated herein by reference in its entirety and made part of the present U.S. Utility patent application for all purposes:

1. U.S. Utility patent application Ser. No. 12/770,068, entitled "Communication device architecture for in-place constructed LDPC (Low Density Parity Check) code," filed Apr. 29, 2010, pending, and subsequently scheduled to be issued as U.S. Pat. No. 8,433,971 on Apr. 30, 2013 (as indicated in an ISSUE NOTIFICATION mailed from the Office on Apr. 10, 2013), which claims priority pursuant to 35 U.S.C. §119(e) to the following U.S. Provisional patent applications which are hereby incorporated herein by reference in their entirety and made part of the present U.S. Utility patent application for all purposes:
   a. U.S. Provisional Application Ser. No. 61/173,963, entitled "Low complexity communication device employing in-place constructed LDPC (Low Density Parity Check) code," filed Apr. 29, 2009, now expired.
   b. U.S. Provisional Application Ser. No. 61/176,601, entitled "Low complexity communication device employing in-place constructed LDPC (Low Density Parity Check) code," filed May 8, 2009, now expired.
   c. U.S. Provisional Application Ser. No. 61/218,415, entitled "Low complexity communication device employing in-place constructed LDPC (Low Density Parity Check) code," filed Jun. 19, 2009, now expired.
   d. U.S. Provisional Application Ser. No. 61/220,183, entitled "Low complexity communication device employing in-place constructed LDPC (Low Density Parity Check) code," now expired.

INCORPORATION BY REFERENCE

The following U.S. Utility patent application is hereby incorporated herein by reference in its entirety and is made part of the present U.S. Utility patent application for all purposes:

1. U.S. Utility patent application Ser. No. 12/769,818, entitled "Low complexity communication device employing in-place constructed LDPC (Low Density Parity Check) code," filed Apr. 29, 2010, now issued as U.S. Pat. No. 8,341,487 B2 on Dec. 25, 2012.

2. U.S. Utility patent application Ser. No. 12/561,374, entitled "Selective merge and partial reuse LDPC (Low Density Parity Check) code construction for limited number of layers Belief Propagation (BP) decoding," filed Sep. 17, 2009, now issued as U.S. Pat. No. 8,392,787 on Mar. 5, 2013, which claims priority pursuant to 35 U.S.C. §119(e) to the following U.S. Provisional patent applications which are hereby incorporated herein by reference in their entirety and made part of the present U.S. Utility patent application for all purposes:
   a. U.S. Provisional Application Ser. No. 61/110,479, entitled "Selective merge and partial reuse LDPC (Low Density Parity Check) code construction for limited number of layers Belief Propagation (BP) decoding," filed Oct. 31, 2008, now expired.
   b. U.S. Provisional Application Ser. No. 61/111,276, entitled "Selective merge and partial reuse LDPC (Low Density Parity Check) code construction for limited number of layers Belief Propagation (BP) decoding," filed Nov. 4, 2008, now expired.
   c. U.S. Provisional Application Ser. No. 61/173,720, entitled "Selective merge and partial reuse LDPC (Low Density Parity Check) code construction for limited number of layers Belief Propagation (BP) decoding," filed Apr. 29, 2009, now expired.

BACKGROUND OF THE INVENTION

1. Technical Field of the Invention

The invention relates generally to design and implementation of communication devices; and, more particularly, it relates to design and implementation of communication device having reduced hardware complexity including sharing of multiple hardware components for use in various applications.

2. Description of Related Art

Data communication systems have been under continual development for many years. One such type of communication system that has been of significant interest lately is a communication system that employs iterative error correction codes (ECCs). Of particular interest is a communication system that employs LDPC (Low Density Parity Check) code. Communications systems with iterative codes are often able to achieve lower bit error rates (BER) than alternative codes for a given signal to noise ratio (SNR).

A continual and primary directive in this area of development has been to try continually to lower the SNR required to achieve a given BER within a communication system. The ideal goal has been to try to reach Shannon's limit in a communication channel. Shannon's limit may be viewed as being the data rate to be used in a communication channel, having a particular SNR, that achieves error free transmission through the communication channel. In other words, the Shannon limit is the theoretical bound for channel capacity for a given modulation and code rate.

LDPC code has been shown to provide for excellent decoding performance that can approach the Shannon limit in some cases. For example, some LDPC decoders have been shown to come within 0.3 dB (decibels) from the theoretical Shannon limit. While this example was achieved using an irregular LDPC code with a length of one million, it nevertheless demonstrates the very promising application of LDPC codes within communication systems.

The use of LDPC coded signals continues to be explored within many newer application areas. Some examples of possible communication systems that may employ LDPC coded signals include communication systems employing 4 wire twisted pair cables for high speed Ethernet applications (e.g., 10 Gbps (Giga-bits per second) Ethernet operation according to the IEEE 802.3an (10 GBASE-T) emerging standard) as well as communication systems operating within a wireless context (e.g., in the IEEE 802.11 context space including the IEEE 802.11n emerging standard).

For any of these particular communication system application areas, near-capacity achieving error correction codes are very desirable. The latency constraints, which would be involved by using traditional concatenated codes, simply preclude their use in such applications in very high data rate communication system application areas.

Generally speaking, within the context of communication systems that employ LDPC codes, there is a first communication device at one end of a communication channel with encoder capability and second communication device at the other end of the communication channel with decoder capability. In many instances, one or both of these two communication devices includes encoder and decoder capability (e.g., within a bi-directional communication system). LDPC codes can be applied in a variety of additional applications as well, including those that employ some form of data storage (e.g., hard disk drive (HDD) applications and other memory storage devices) in which data is encoded before writing to the storage media, and then the data is decoded after being read/retrieved from the storage media.

BRIEF DESCRIPTION OF THE SEVERAL VIEWS OF THE DRAWINGS

FIG. 8 illustrates an embodiment of an LDPC matrix (1/2 code rate) [base LDPC matrix] from which other LDPC matrices may be constructed.

FIG. 9 illustrates an embodiment of an LDPC matrix (2/3 code rate) that is constructed from the base LDPC matrix (1/2 code rate).

FIG. 10 illustrates an embodiment of an LDPC matrix (3/4 code rate) that is constructed from the base LDPC matrix (1/2 code rate) or the LDPC matrix (2/3 code rate).

FIG. 11 illustrates an embodiment of an LDPC matrix (5/6 code rate) that is constructed from the base LDPC matrix (1/2 code rate), the LDPC matrix (2/3 code rate), or the LDPC matrix (3/4 code rate).

FIG. 14 illustrates an embodiment of a comparison between a re-use type LDPC decoder and an in-place type LDPC decoder.

FIG. 16A, FIG. 16B, and FIG. 17A illustrate various embodiments of methods for construction of various LDPC matrices from one or more base LDPC matrices.

FIG. 17B illustrate an embodiment of a method for selectively employing various circuitry subsets of an LDPC decoder to effectuate decoding of various LDPC coded signals.

FIG. 18 illustrates an alternative embodiment of an LDPC matrix (1/2 code rate) [base LDPC matrix] from which other LDPC matrices may be constructed.

FIG. 19 illustrates an embodiment of an LDPC matrix (5/8 code rate) that is constructed from the base LDPC matrix (1/2 code rate) of FIG. 18.

FIG. 20 illustrates an embodiment of an LDPC matrix (2/3 code rate) that is constructed from the base LDPC matrix (1/2 code rate) of FIG. 18 or the LDPC matrix (5/8 code rate) of FIG. 19.

FIG. 21 illustrates an embodiment of an LDPC matrix (13/16 code rate) that is constructed from the base LDPC matrix (1/2 code rate) of FIG. 18, the LDPC matrix (5/8 code rate) of FIG. 19, or the LDPC matrix (2/3 code rate) of FIG. 20.

FIG. 23 illustrates an alternative embodiment of an LDPC matrix (1/2 code rate) [base LDPC matrix] from which other LDPC matrices may be constructed.

FIG. 24 illustrates an embodiment of an LDPC matrix (5/8 code rate) that is constructed from the base LDPC matrix (1/2 code rate) of FIG. 23.

FIG. 25 illustrates an embodiment of an LDPC matrix (3/4 code rate) that is constructed from the base LDPC matrix (1/2 code rate) of FIG. 23 or the LDPC matrix (5/8 code rate) of FIG. 24.

FIG. 26 illustrates an embodiment of an LDPC matrix (5/8 code rate) that is constructed from the base LDPC matrix (1/2 code rate) of FIG. 23, the LDPC matrix (5/8 code rate) of FIG. 24, or the LDPC matrix (3/4 code rate) of FIG. 25.

FIG. 27 illustrates an alternative embodiment of an alternate LDPC matrix (5/8 code rate) that is constructed from the base LDPC matrix (1/2 code rate) of FIG. 23.

FIG. 35A illustrates an embodiment of a method for generating an LDPC coded signal to be launched within a communication channel.

FIG. 35B illustrates an alternative embodiment of a method for generating an LDPC coded signal to be launched within a communication channel.

FIG. 36A illustrates an embodiment of a method for performing decoding of LDPC signals using a superimposed LDPC matrix corresponding to an in-place LDPC code set.

FIG. 36B illustrates an embodiment of a method for performing encoding of LDPC signals using a superimposed LDPC matrix, and its associated generator matrices, corresponding to an in-place LDPC code set.

DETAILED DESCRIPTION OF THE INVENTION

Figure 1:
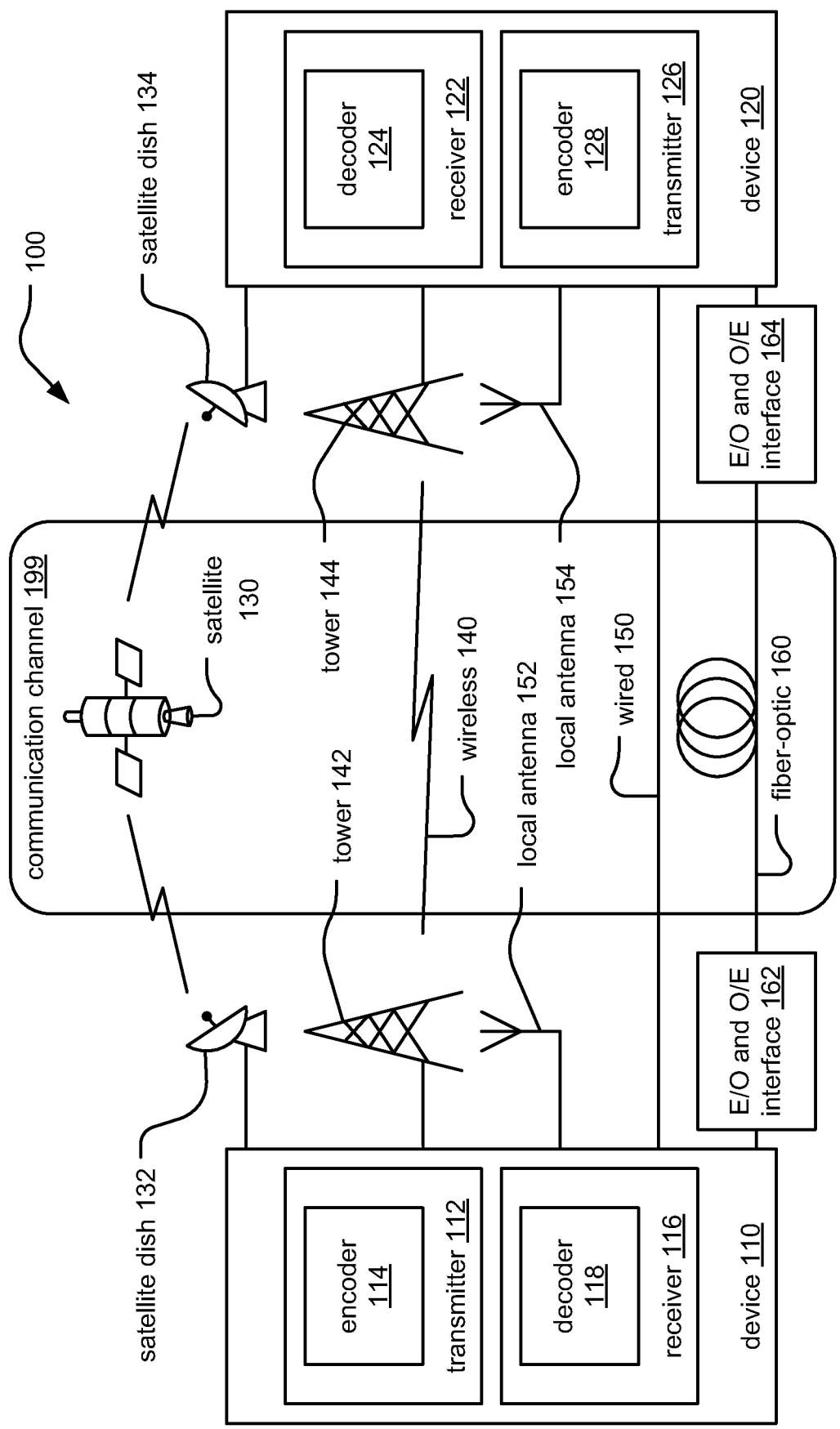
FIG. 1 and FIG. 2 illustrate various embodiments of communication systems.

The goal of digital communications systems is to transmit digital data from one location, or subsystem, to another either error free or with an acceptably low error rate. As shown in FIG. 1, data may be transmitted over a variety of communications channels in a wide variety of communication systems: magnetic media, wired, wireless, fiber, copper, and other types of media as well.

Figure 2:
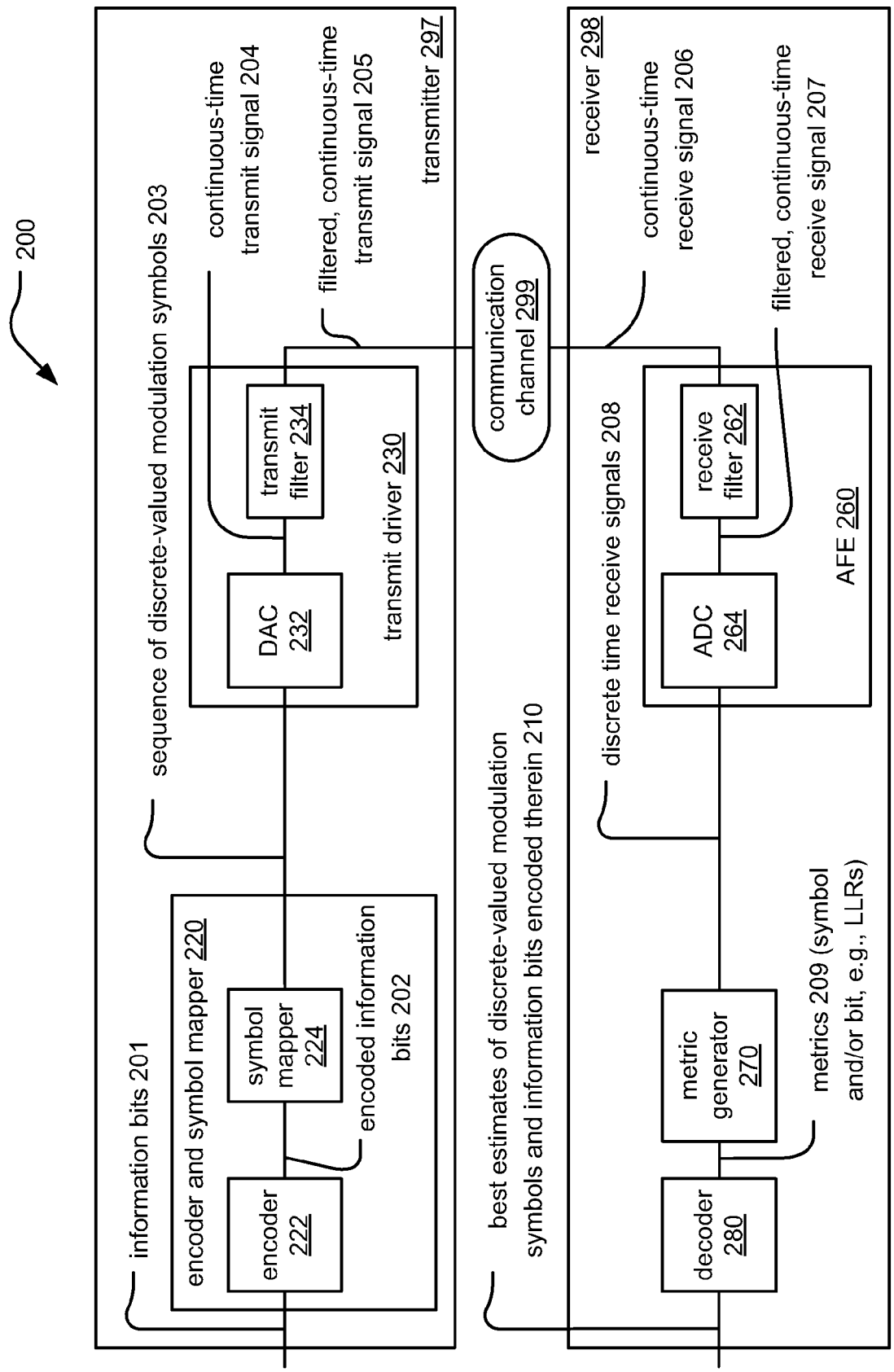

FIG. 1 and FIG. 2 are diagrams illustrate various embodiments of communication systems, 100 and 200, respectively.

Referring to FIG. 1, this embodiment of a communication system 100 is a communication channel 199 that communicatively couples a communication device 110 (including a transmitter 112 having an encoder 114 and including a receiver 116 having a decoder 118) situated at one end of the communication channel 199 to another communication device 120 (including a transmitter 126 having an encoder 128 and including a receiver 122 having a decoder 124) at the other end of the communication channel 199. In some embodiments, either of the communication devices 110 and 120 may only include a transmitter or a receiver. There are several different types of media by which the communication channel 199 may be implemented (e.g., a satellite communication channel 130 using satellite dishes 132 and 134, a wireless communication channel 140 using towers 142 and 144 and/or local antennae 152 and 154, a wired communication channel 150, and/or a fiber-optic communication channel 160 using one or more of an electrical to optical (E/O) interfaces [in one direction] and optical to electrical (O/E) interfaces [in opposite direction], as shown by reference numerals 162 and 164, respectively, to convert electrical signals to optical signals for transmission via optical communication media, and to convert optical signals to electrical signals for transmission via electrical communication media). In addition, more than one type of media may be implemented and interfaced together thereby forming the communication channel 199.

To reduce transmission errors that may undesirably be incurred within a communication system, error correction and channel coding schemes are often employed. Generally, these error correction and channel coding schemes involve the use of an encoder at the transmitter and a decoder at the receiver.

Any of the various types of LDPC codes described herein can be employed within any such desired communication system (e.g., including those variations described with respect to FIG. 1), any information storage device (e.g., hard disk drives (HDDs), network information storage devices and/or servers, etc.) or any application in which information encoding and/or decoding is desired.

Referring to the communication system 200 of FIG. 2, at a transmitting end of a communication channel 299, information bits 201 are provided to a transmitter 297 that is operable to perform encoding of these information bits 201 using an encoder and symbol mapper 220 (which may be viewed as being distinct functional blocks 222 and 224, respectively) thereby generating a sequence of discrete-valued modulation symbols 203 that is provided to a transmit driver 230 that uses a DAC (Digital to Analog Converter) 232 to generate a continuous-time transmit signal 204 and a transmit filter 234 to generate a filtered, continuous-time transmit signal 205 that substantially comports with the communication channel 299. At a receiving end of the communication channel 299, continuous-time receive signal 206 is provided to an AFE (Analog Front End) 260 that includes a receive filter 262 (that generates a filtered, continuous-time receive signal 207) and an ADC (Analog to Digital Converter) 264 (that generates discrete-time receive signals 208). A metric generator 270 calculates metrics 209 (e.g., on either a symbol and/or bit basis) that are employed by a decoder 280 to make best estimates of the discrete-valued modulation symbols and information bits encoded therein 210.

The encoder and/or decoders of either of the previous embodiments may be implemented to include various aspects and/or embodiment of the invention therein. In addition, several of the following Figures describe other and particular embodiments (some in more detail) that may be used to support the devices, systems, functionality and/or methods that may be implemented in accordance with certain aspects and/or embodiments of the invention. For example, two or more LDPC codes, in accordance with an in-place LDPC code set, may be employed such that a communication device may switch between and among those two or more LDPC codes of the in-place LDPC code set. The selection and switching between the various LDPC codes may be based on any one or more of a number of conditions and/or in response to any one or more of a number of conditions.

In one embodiment, a predetermined sequence is used to direct the switching from a first LDPC code, to a second LDPC code, and so on within the in-place LDPC code set. In another embodiment, switching among the various LDPC codes of the in-place LDPC code set may be performed based on certain operating conditions (e.g., signal to noise ratio (SNR), noise, bit error rate (BER) or block error rate (BLER), etc.). Certain of such operating conditions may be specific to a communication device itself (e.g., temperature, operating speed, available processing resources, etc.). In accordance with a communication device that is compliant in accordance with a particular communication standard, recommended practice, etc., the particular LDPC codes (the in-place LDPC code set) may be determined or defined thereby. In addition, in accordance with such communication standards, recommended practices, etc., the manner in which switching between the various LDPC codes may likewise be determined or defined thereby.

One particular type of signal that is processed according to certain aspects and/or embodiments of the invention is an LDPC coded signal. A general description of LDPC codes is provided below as well.

Figure 3:
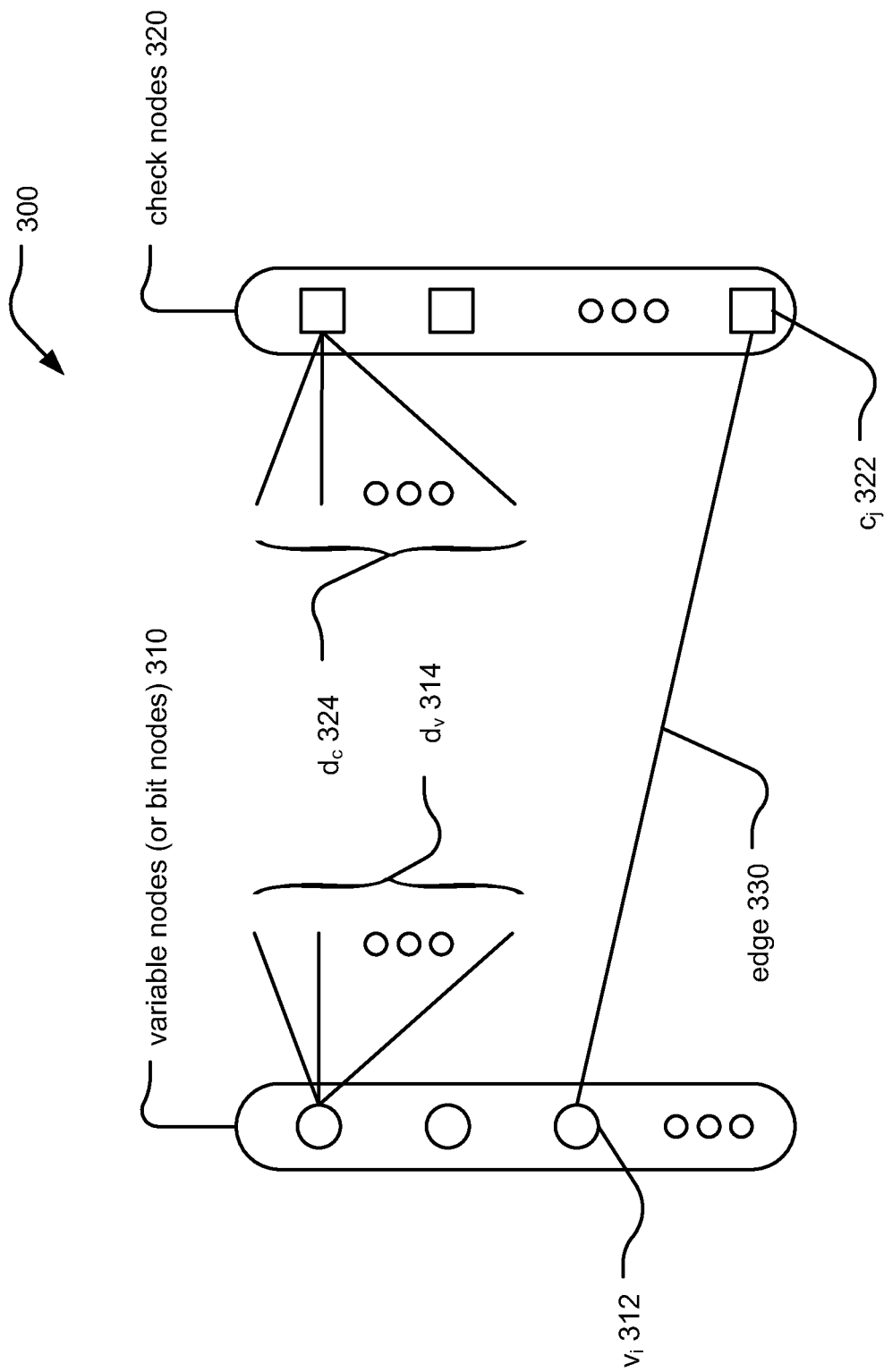
FIG. 3 illustrates an embodiment of an LDPC (Low Density Parity Check) code bipartite graph.

FIG. 3 illustrates an embodiment of an LDPC (Low Density Parity Check) code bipartite graph 300. In the art, an LDPC bipartite graph may also sometimes be referred to as a "Tanner" graph. An LDPC code may be viewed as being a code having a binary parity check matrix such that nearly all of the elements of the matrix have values of zeroes (e.g., the binary parity check matrix is sparse). For example, $H=(h_{i,j})_{M \times N}$ may be viewed as being a parity check matrix of an LDPC code with block length N.

LDPC codes are linear block codes and hence the set of all codewords x∈C spans the null space of a parity check matrix, H.

$$Hx^T = 0, \forall x \in C \quad (1)$$

For LDPC codes, H, is a sparse binary matrix of dimension m×n. Each row of H corresponds to a parity check and a set element $h_{ij}$, indicates that data symbol j participates in parity check i. Each column of H corresponds to a codeword symbol.

For each codeword x there are n symbols of which m are parity symbols. Hence the code rate r is given by:

$$r = (n-m)/n \quad (2)$$

The row and column weights are defined as the number of set elements in a given row or column of H, respectively. The set elements of H are chosen to satisfy the performance requirements of the code. The number of 1's in the i-th column of the parity check matrix, H, may be denoted as $d_v(i)$, and the number of 1's in the j-th row of the parity check matrix may be denoted as $d_c(j)$. If $d_v(i) = d_v$ for all i, and $d_c(j) = d_c$ for all j, then the LDPC code is called a $(d_v, d_c)$ regular LDPC code, otherwise the LDPC code is called an irregular LDPC code.

LDPC codes were introduced by R. Gallager in [1] referenced below (also in [2] referenced below) and by M. Luby et al. in [3] also referenced below.

[1] R. Gallager, *Low-Density Parity-Check Codes*, Cambridge, Mass.: MIT Press, 1963.
[2] R. G. Gallager, "Low density parity check codes," *IRE Trans. Info. Theory*, vol. IT-8, January 1962, pp. 21-28.
[3] M. G. Luby, M. Mitzenmacher, M. A. Shokrollahi, D. A. Spielman, and V. Stemann, "Practical Loss-Resilient Codes," *Proc. 29th Symp. on Theory of Computing*, 1997, pp. 150-159.

A regular LDPC code can be represented as a bipartite graph 300 by its parity check matrix with left side nodes representing variable of the code bits (or alternatively as the "variable nodes" (or "bit nodes") 310 in a bit decoding approach to decoding LDPC coded signals), and the right side nodes representing check equations (or alternatively as the "check nodes" 320). The bipartite graph 300 (or sometimes referred to as a Tanner graph 300) of the LDPC code defined by H may be defined by N variable nodes (e.g., N bit nodes) and M check nodes. Every variable node of the N variable nodes 310 has exactly $d_v(i)$ edges (an example edge shown using reference numeral 330) connecting the bit node, $v_i$ 312, to one or more of the check nodes (within the M check nodes). The edge 330 is specifically shown as connecting from the bit node, $v_i$ 312, to the check node, $c_j$ 322. This number of $d_v$ edges (shown as $d_v$ 314) may be referred to as the degree of a variable node i. Analogously, every check node of the M check nodes 320 has exactly $d_c(j)$ edges (shown as $d_c$ 324) connecting this node to one or more of the variable nodes (or bit nodes) 310. This number of edges, $d_c$, may be referred to as the degree of the check node j.

An edge 330 between a variable node $v_i$ (or bit node $b_i$) 312 and check node $c_j$ 322 may be defined by e = (i, j). However, on the other hand, given an edge e = j, the nodes of the edge may alternatively be denoted as by e = (v(e), c(e)) (or e = (b(e), c(e))). Alternatively, the edges in the graph correspond to the set elements of H where a set element $h_{ji}$ indicates that an edge connects a bit (e.g., variable) node i with parity check node j.

Given a variable node $v_i$ (or bit node $b_i$), one may define the set of edges emitting from the node $v_i$ (or bit node $b_i$) by $E_v(i) = \{e | v(e) = i\}$ (or by $E_b(i) = \{e | b(e) = i\}$); these edges are referred to as bit edges, and the messages corresponding to these bit edges are referred to as bit edge messages.

Given a check node $c_j$, one may define the set of edges emitting from the node $c_j$ by $E_c(j) \{e | c(e) = j\}$; these edges are referred to as check edges, and the messages corresponding to these check edges are referred to as check edge messages. Continuing on, the derivative result will be $|E_v(i)| = d_v$ (or $E_b(i)| = d_b$) and $|E_c(j)| = d_c$.

Generally speaking, any codes that can be represented by a bipartite graph may be characterized as a graph code. It is also noted that an irregular LDPC code may also described using a bipartite graph. However, the degree of each set of nodes within an irregular LDPC code may be chosen according to some distribution. Therefore, for two different variable nodes, $v_{i_1}$ and $v_{i_2}$, of an irregular LDPC code, $|E_v(i_1)|$ may not equal to $|E_v(i_2)|$. This relationship may also hold true for two check nodes. The concept of irregular LDPC codes was originally introduced within M. Luby et al. in [3] referenced above.

In general, with a graph of an LDPC code, the parameters of an LDPC code can be defined by a degree of distribution, as described within M. Luby et al. in [3] referenced above and also within the following reference [4]:

[4] T. J. Richardson and R. L. Urbanke, "The capacity of low-density parity-check code under message-passing decoding," *IEEE Trans. Inform. Theory*, Vol. 47, No. 2, February 2001, pp. 599-618.

This distribution may be described as follows:
Let $\lambda_i$ represent the fraction of edges emanating from variable nodes of degree i and let $\rho_i$, represent the fraction of edges emanating from check nodes of degree i. Then, a degree distribution pair $(\lambda, \rho)$ is defined as follows:

$$\lambda(x) = \sum_{i=2}^{M_v} \lambda_i x^{i-1} \text{ and } \rho(x) = \sum_{i=2}^{M_c} \rho_i x^{i-1},$$

where $M_v$ and $M_c$ represent the maximal degrees for variable nodes and check nodes, respectively.

While many of the illustrative embodiments described herein utilize regular LDPC code examples, it is noted that certain aspects and/or embodiments of the invention are also operable to accommodate both regular LDPC codes and irregular LDPC codes.

It is also noted that many of the embodiments described herein employ the terminology of "bit node" and "bit edge message", or equivalents thereof. Oftentimes, in the art of LDPC decoding, the "bit node" and "bit edge message" are alternatively referred to as "variable node" and "variable edge message", in that, the bit values (or variable values) are those which are attempted to be estimated. Either terminology can be employed in accordance with certain aspects of the invention.

Figure 4:
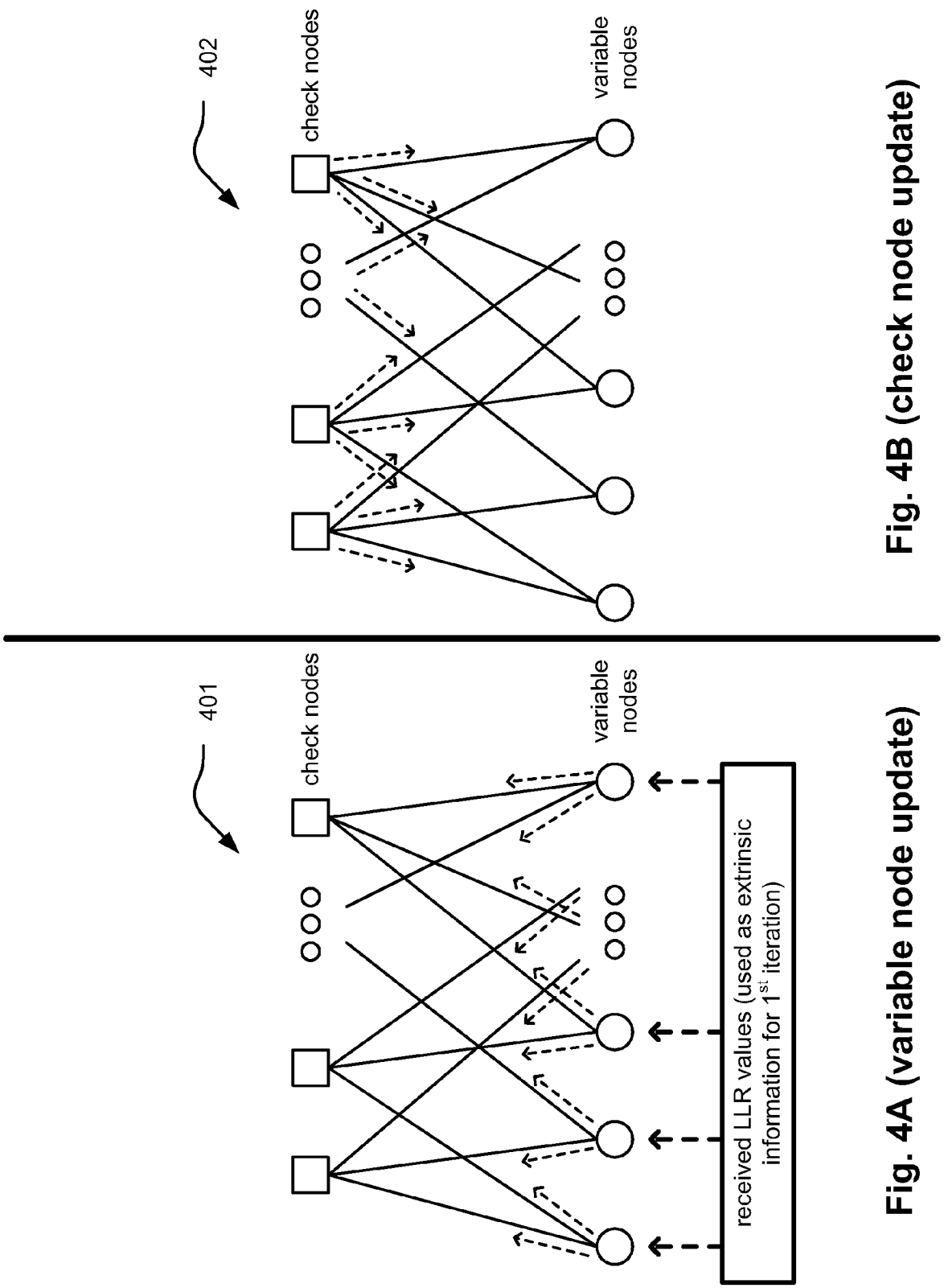
FIG. 4A illustrates an embodiment of variable node update with reference to an LDPC code bipartite graph.
FIG. 4B illustrates an embodiment of check node update with reference to an LDPC code bipartite graph.

FIG. 4A illustrates an embodiment 401 of variable node update with reference to an LDPC code bipartite graph. FIG. 4B illustrates an embodiment 402 of check node update with reference to an LDPC code bipartite graph. These two diagrams may be considered in conjunction with one another.

A signal received from a communication channel undergoes appropriate demodulation (e.g., processing within an analog front end including digital sampling, filtering, gain adjustment, etc.) to generate a received bit sequence. Then, log-likelihood ratios (LLRs) are calculated for each bit location within the received bit sequence. These LLRs correspond respectively to bit nodes of the LDPC code and its corresponding LDPC bipartite graph.

During initialization, the LLRs are employed for the bit edge messages (e.g., extrinsic information) for each edge emanating from each respective variable node. Thereafter, check node processing or check node updating is performed using the original bit edge messages (e.g., the calculated LLRs). These updated check edge messages are then employed to perform bit node processing or bit node updating to update the variable node soft information for use in the next decoding iteration. The variable node soft information is then used to calculate the variable node edge messages (extrinsic information) for this next decoding iteration.

These variable node edge messages are then used in accordance with check node processing or check node updating to calculate updated check edge messages. Subsequently, these most recently updated check edge messages are then employed to perform bit node processing or bit node updating to update the variable node soft information once again.

After a final decoding iteration, which may be determined based on some parameter (e.g., a predetermined number of decoding iterations or when all syndromes of the LDPC code equal zero), the last calculated variable node soft information may undergo hard limiting (e.g., in a slicer) to generate estimates of the bits encoded within the received signal.

Figure 5:
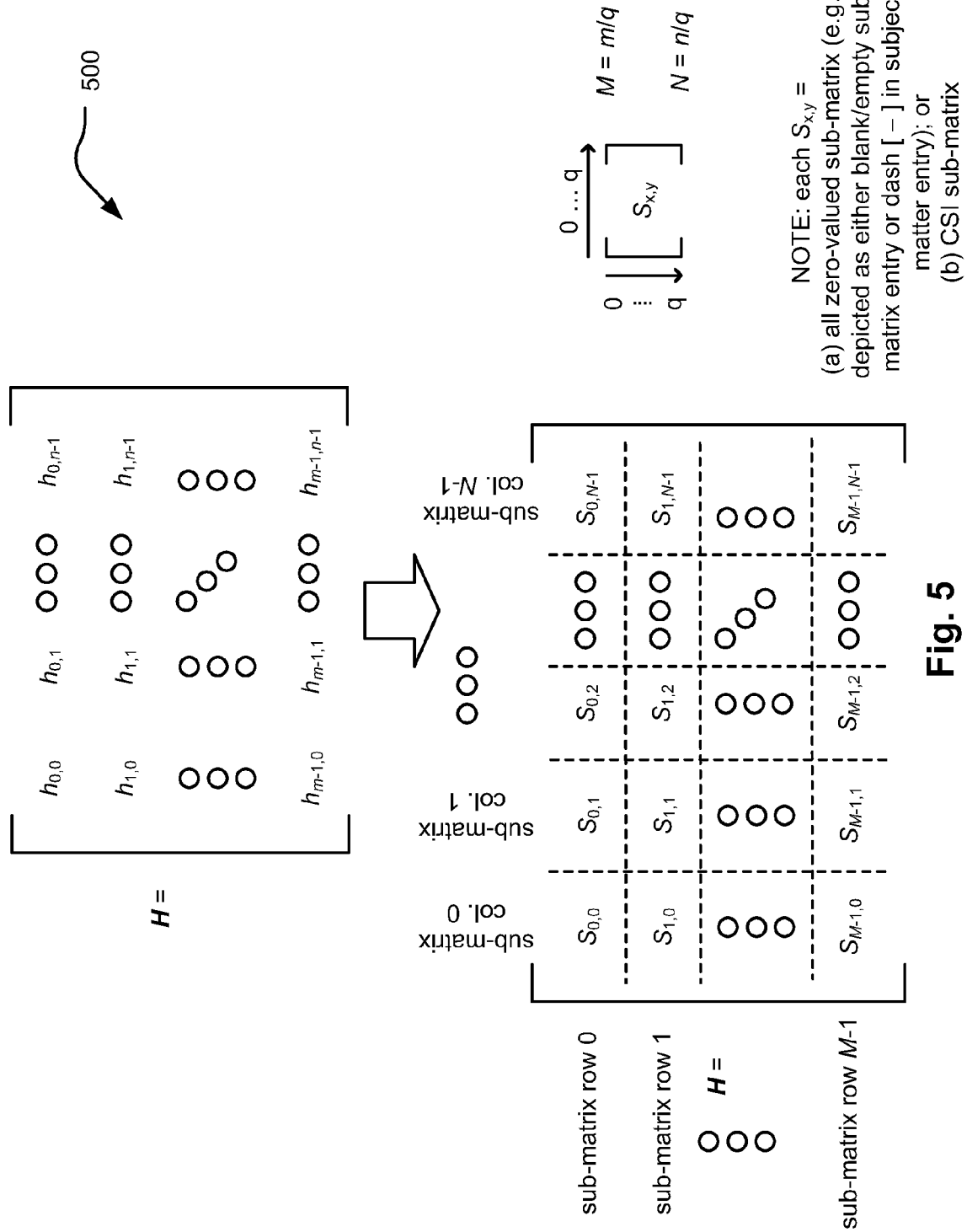
FIG. 5 illustrates an embodiment of the relationship between an overall LDPC matrix and the individual sub-matrices therein that include all zero-valued sub-matrices and/or CSI (Cyclic Shifted Identity) sub-matrices (including the sub-matrix rows and sub-matrix columns of the LDPC matrix).

FIG. 5 illustrates an embodiment 500 of the relationship between an overall LDPC matrix and the individual sub-matrices therein that include all zero-valued sub-matrices and/or CSI (Cyclic Shifted Identity) sub-matrices (including the sub-matrix rows and sub-matrix columns of the LDPC matrix).

A binary LDPC code may be fully described by its parity check matrix (i.e., its LDPC matrix). At the top of FIG. 5, the individual elements of an LDPC matrix, H, are shown:

$$H = \begin{bmatrix} h_{0,0} & h_{0,1} & \ldots & h_{0,n-1} \\ h_{1,0} & h_{1,1} & \ldots & h_{1,n-1} \\ \ldots & \ldots & \ldots & \ldots \\ h_{m-1,0} & h_{m-1,1} & \ldots & h_{m-1,n-1} \end{bmatrix}$$

where n is the number of bits in a codeword, m is the number of parity check equations of the LDPC code, and $h_{i,j}$ is either 0 or 1. An n-bit vector c (e.g., $c=(c_1, c_2, \ldots, c_N)$) is a codeword (i.e., of the LDPC code) if and only if $$Hc^T = 0.$$

For such an LDPC code, the parity matrix H is also composed of a number of q-by-q (i.e., q×q) square sub-matrices as shown in the bottom portion of FIG. 5 and also below:

$$H = \begin{bmatrix} S_{0,0} & S_{0,1} & \ldots & S_{0,N-1} \\ S_{1,0} & S_{1,1} & \ldots & S_{1,N-1} \\ \ldots & \ldots & \ldots & \ldots \\ S_{M-1,0} & S_{M-1,1} & \ldots & S_{M-1,N-1} \end{bmatrix}$$

where M=m/q, N=n/q, and each sub-matrix, $s_{I,J}$, thereof is a q-by-q sub-matrix that is either an all-zero-valued sub-matrix (i.e., in which all elements thereof are the value of zero "0", which is depicted by a blank or empty sub-matrix in the associated diagrams) or a CSI (Cyclic Shifted Identity) sub-matrix. A CSI sub-matrix S is characterized by a shift-value, μ(S), such that the components of S are defined as follows:

$$s_{i,j} = \begin{cases} 1 & \text{if } i + \lambda(S) = j \,(\text{mod}\, q) \\ 0 & \text{otherwise} \end{cases}$$

for any i and j, with 0≤i<q and 0≤j<q. For example, the q-by-q identity matrix is itself a CSI matrix with a shift-value λ(S)=0 (i.e., a CSI sub-matrix that has undergone a cyclic shift of zero "0").

As can be seen, the LDPC matrix (as depicted in the lower portion of the diagram), includes various sub-matrix rows and sub-matrix columns. These sub-matrix rows and sub-matrix columns may be viewed as being based on the sub-matrix construction of the LDPC matrix (e.g., shown as sub-matrix rows 0 through M−1 and sub-matrix columns 0 through N−1).

A novel means is presented herein by which intelligent design of a various LDPC codes, having at least some shared and common structure, allows for a very efficient hardware design and implementation. Because the various LDPC codes share common characteristics, effective sharing of hardware resources within a communication device may be made. This allows for cost savings, real estate minimization (reduced area), reduced power consumption (highly desirable in portable communication device applications), lower latency constraints (e.g., for storage applications), etc. in the design and manufacturing of one or more portions of a communication device.

For example, in accordance with certain advanced communication system applications (e.g., such as that in accordance with standards and/or recommended practices associated with the WGA (Wireless Gigabit Alliance, alternatively, referred to as WiGig), which was formerly known as NGmS (Next Generation millimeter wave Specification)), there may be a need or desire to support more than one LDPC code. Such different LDPC codes may also have different respective code rates (e.g., an LDPC code 1 having code rate 1, an LDPC code 2 having code rate 2, etc.). In addition, ever-increasing data throughput is a primary design directive in accordance with virtually every communication system, and coded throughput rates in the range of 1 to 9 Gbps (Giga-bits per second) is sought in certain applications.

The LDPC code set construction means presented herein enables design of an LDPC decoder, that may be implemented within any of a variety of communication devices, to support a low complexity layer decoding and also allows for a fully parallel decoding approach.

In accordance with this design approach, an embodiment is presented herein in which various LDPC matrices, having shared characteristics, are designed having code rates of 1/2, 2/3, 3/4, and 5/6, respectively. The sub-matrix size of these various LDPC matrices is 28×28 (i.e., 28 square). In these embodiments, all codes have a column weight of 1 layer.

When starting with a base LDPC matrix having a lowest code rate (e.g., 1/2), then higher code rate LDPC matrices are formed by removing rows there from and adding elements to those remaining rows. Conversely, when starting with a base LDPC matrix having a highest code rate (e.g., 5/6), then lower code rate LDPC matrices are formed by adding rows thereto and adding elements to those added rows while also deleting elements from the existing rows of the base LDPC matrix having a highest code rate (e.g., 5/6).

In accordance with one embodiment, the LDPC code constraints include a block length of 672 bits, a CSI type LDPC matrix construction (e.g., as described above with reference to FIG. 5), a dual diagonal characteristic (e.g., the right hand side of the LDPC matrix having a lower diagonal format to allow for LDPC encoding by using the very same LDPC matrix by simply performing back-substitution), a column weight that is greater than or equal to 4. Also, in embodiments where layered decoding is desired, a column weight of 1 per layer, and a maximum of 4 layers per code may be employed.

Figure 6:
FIG. 6 illustrates an embodiment of various code rate options for a codeword having a predetermined size (e.g., 672 in this embodiment).

FIG. 6 illustrates an embodiment 600 of various code rate options for a codeword having a predetermined size (e.g., 672 in this embodiment). This diagram shows the relationships between some various sub-matrix sizes (e.g., 42 square, 28 square, and 21 square) and the associated maximum row weight, the number of sub-matrix rows and sub-matrix columns (e.g., 8 sub-matrix rows×16 sub-matrix columns for a rate 1/2 LDPC code employing sub-matrices of size 42 square, 12 sub-matrix rows×24 sub-matrix columns for a rate 1/2 LDPC code employing sub-matrices of size 28 square, etc.). As can be seen, the best performance is achieved using the LDPC matrices whose respective sub-matrices have size of 42 square.

Figure 7:
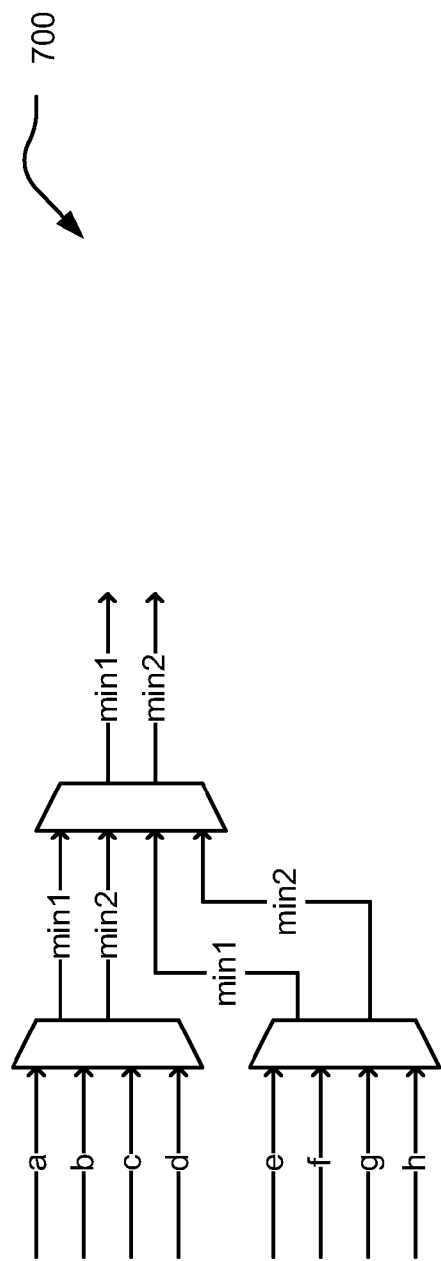
FIG. 7 illustrates an embodiment of check node architecture.

FIG. 7 illustrates an embodiment 700 of check node architecture. Because of the shared characteristics among the various LDPC codes, selective enabling of various portions of the LDPC circuitry can be made to allow for decoding of different signals encoded in accordance with various LDPC codes.

For example, in some embodiments of LDPC decoding, min-sum decoding may be performed. For example, min1/min2 check node processing or calculation is made by finding the first and second minimum check edge message values across all of the check edge message input magnitudes. This then operates by setting all outputs as the first minimum value except the input corresponding to the first minimum value, which is set to the second minimum value.

Considering the upper left hand side of the diagram, the hardware circuitry may be implemented using a tree with various multiplexor (MUX) stages. With reference to the LDPC matrices having the various sub-matrix sizes (e.g., 42 square, 28 square, and 21 square) as shown in the previous diagram, the corresponding various tree stages are shown at the bottom of the table at the bottom of the diagram.

FIG. 8 illustrates an embodiment 800 of an LDPC matrix (1/2 code rate) [base LDPC matrix] from which other LDPC matrices may be constructed. This base LDPC matrix includes 12 sub-matrix rows and 24 sub-matrix columns. The sub-matrix size is 28 square (i.e., 28×28). Each sub-matrix within this LDPC matrix is a CSI sub-matrix is characterized by a shift-value, $\lambda(S)$, or an all-zero-valued sub-matrix (i.e., all elements of that respective sub-matrix being a 0).

For example, the bottom left hand sub-matrix has a value of 20, and is therefore a CSI sub-matrix with a shift-value of 20, $\lambda(20)$. As also mentioned herein, a CSI sub-matrix with a shift-value of 0, $\lambda(0)$, is an identity sub-matrix. All of the sub-matrices depicted as a blank or empty sub-matrix are all zero-valued sub-matrices.

Because the right hand side of this LDPC matrix has a lower triangular format, LDPC encoding may be performed by using this very same LDPC matrix as the generator matrix and by simply performing back-substitution to generate an LDPC codeword.

FIG. 9 illustrates an embodiment 900 of an LDPC matrix (2/3 code rate) that is constructed from the base LDPC matrix (1/2 code rate). As can be seen, when comparing this LDPC matrix (2/3 code rate) to the previous LDPC matrix (1/2 code rate), the LDPC matrix (2/3 code rate) is formed by removing the top 4 rows of the LDPC matrix (1/2 code rate). By adding additional elements to the remaining, existing rows (that have not been removed), an average column weight of 3 to 4 is maintained.

FIG. 10 illustrates an embodiment 1000 of an LDPC matrix (3/4 code rate) that is constructed from the base LDPC matrix (1/2 code rate) or the LDPC matrix (2/3 code rate). As can be seen, when comparing this LDPC matrix (3/4 code rate) to the previous LDPC matrix (2/3 code rate), the LDPC matrix (3/4 code rate) is formed by removing the top 2 rows of the LDPC matrix (2/3 code rate). Again, by adding additional elements to the remaining, existing rows (that have not been removed), an average column weight of 3 to 4 is maintained.

FIG. 11 illustrates an embodiment 1100 of an LDPC matrix (5/6 code rate) that is constructed from the base LDPC matrix (1/2 code rate), the LDPC matrix (2/3 code rate), or the LDPC matrix (3/4 code rate). As can be seen, when comparing this LDPC matrix (5/6 code rate) to the previous LDPC matrix (3/4 code rate), the LDPC matrix (5/6 code rate) is formed by removing the top 2 rows of the LDPC matrix (3/4 code rate). Again, by adding additional elements to the remaining, existing rows (that have not been removed), an average column weight of 3 to 4 is maintained.

Oftentimes performance diagrams are described in the context of BLER (Block Error Rate) [or BER (Bit Error Rate)] versus $E_b/N_o$ (ratio of energy per bit $E_b$ to the Spectral Noise Density $N_o$) or SNR (Signal to Noise Ratio). This term $E_b/N_o$ is the measure of SNR for a digital communication system. When looking at such performance curves, the BLER [or BER] may be determined for any given $E_b/N_o$ (or SNR) thereby providing a relatively concise representation of the performance of the decoding approach.

Figure 12:
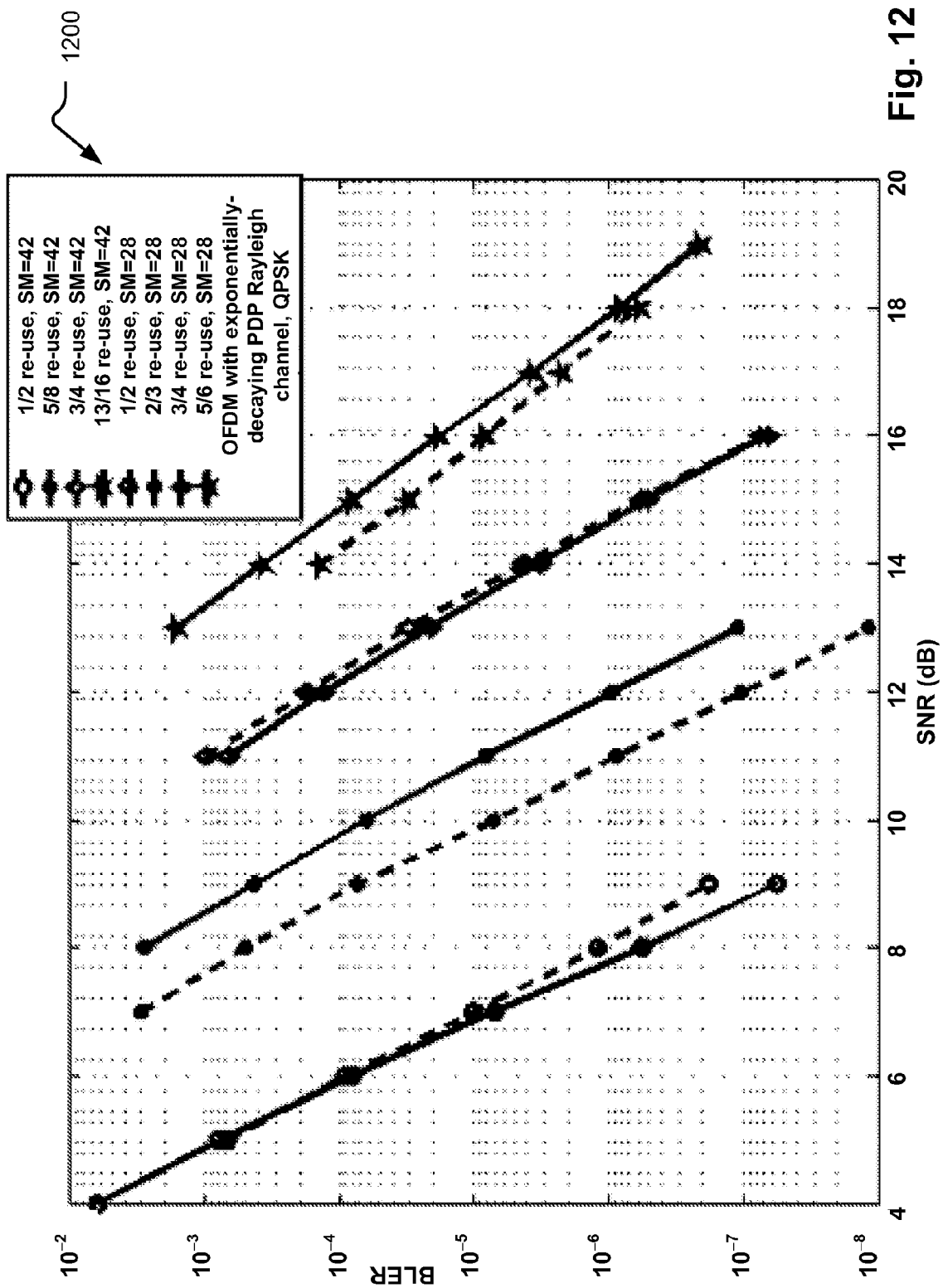
FIG. 12 illustrates an embodiment of performance comparisons of various LDPC codes, having various respective code rates, using orthogonal frequency division multiplexing (OFDM) signaling with exponential decaying on a power delay profile (PDP) in accordance with quadrature phase shift keying (QPSK) modulation on Rayleigh fading communication channel.

FIG. 12 illustrates an embodiment 1200 of performance comparisons of various LDPC codes, having various respective code rates, using orthogonal frequency division multiplexing (OFDM) signaling with exponential decaying on a power delay profile (PDP) in accordance with quadrature phase shift keying (QPSK) modulation on a Rayleigh fading communication channel.

As can be seen in this diagram, there is relatively similar performance between LDPC codes constructed in accordance with a re-use methodology and LDPC codes constructed in accordance with an in-place methodology. Also, various embodiments and architectures that may be implemented within a communication device that employs an in-place LDPC code set may employ certain aspects as describes in accordance with elective merge and partial reuse LDPC (Low Density Parity Check) code construction for limited number of layers Belief Propagation (BP) decoding (as described in the patent application that has been incorporated herein by reference as cited above).

Figure 13:
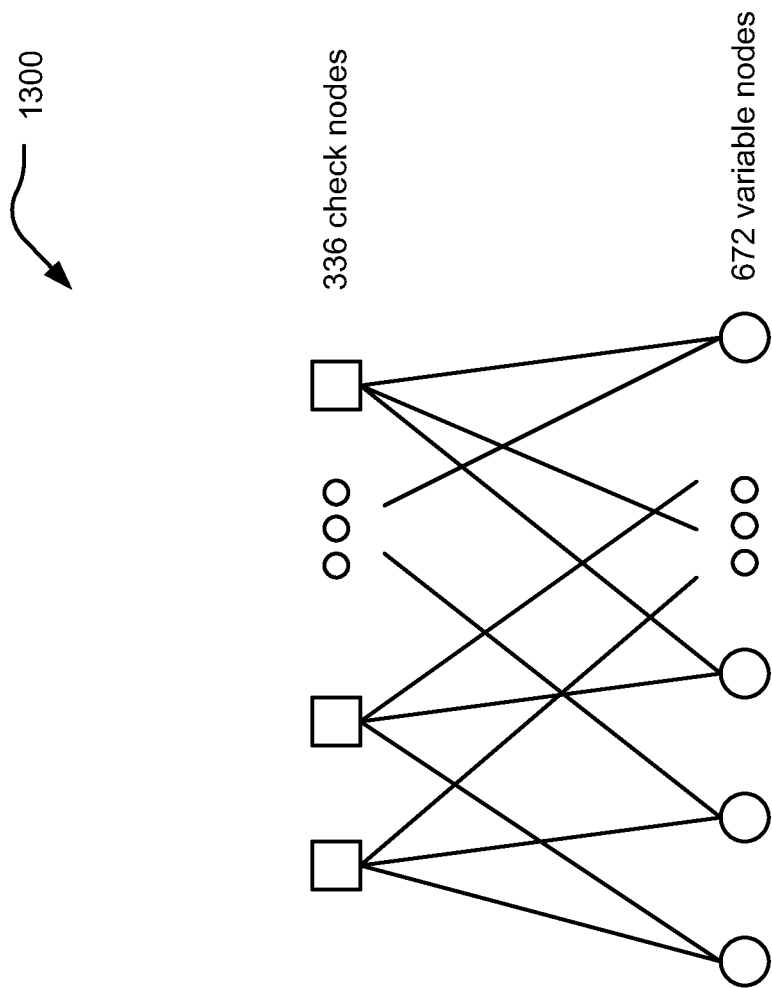
FIG. 13 illustrates an embodiment of relationship between check nodes and variable nodes in a fully parallel belief propagation (BP) decoder architecture.

FIG. 13 illustrates an embodiment 1300 of relationship between check nodes and variable nodes in a fully parallel belief propagation (BP) decoder architecture. To effectuate a fully parallel BP decoder architecture, the LDPC decoder may be efficiently designed to capitalize on the super-position of the various LDPC matrices with one another. For example, each LDPC matrix shares at least some common characteristics with other of the LDPC codes. When decoding certain signals corresponding to certain of the LDPC codes, portions of the LDPC decoder circuitry may be gated off (e.g., disabled, switched off, etc.); for example, un-used check edge message updating circuitry and/or un-used variable/bit edge message edge updating circuitry may be gated off depending on which LDPC code is selected. In another example, this may be effectuated by gating off un-used variable/bit edge message edge updating circuitry by placing the corresponding one or more MUXs in a 0 value while gating off un-used check edge message edge updating circuitry may be effectuated by placing the corresponding one or more MUXs in the maximum, positive corresponding message value (e.g., 11111 in a 5 bit message representation in accordance with sign-magnitude formatting). It is noted that very little switching circuitry (or multiplexing circuitry) is required at the inputs of the check edge message updating circuitry and the inputs of the variable/bit edge message edge updating circuitry to support all LDPC codes in the entire set.

Generally speaking, the entire LDPC matrix (e.g., associated with the largest LDPC matrix having the lowest code rate) is instantiated in hardware. In a fully parallel BP decoding architecture, all check edge message and all bit edge messages are processed in parallel with one another during each clock cycle.

FIG. 14 illustrates an embodiment 1400 of a comparison between a re-use type LDPC decoder and an in-place type LDPC decoder. Comparison of the different types of LDPC code construction, and associated hardware within a communication device, is shown between a parallel implemented LDPC decoder that operates in accordance with re-use construction and a parallel implemented LDPC decoder that operates in accordance with in-place construction. It can be seen that the in-place LDPC code implementation is not quite as area efficient as a re-use set LDPC decoder. However, the in-place LDPC code implementation does in fact operate at a slightly faster clock frequency due to the shorter critical path therein (i.e., there are no hierarchical check nodes therein).

Figure 15:
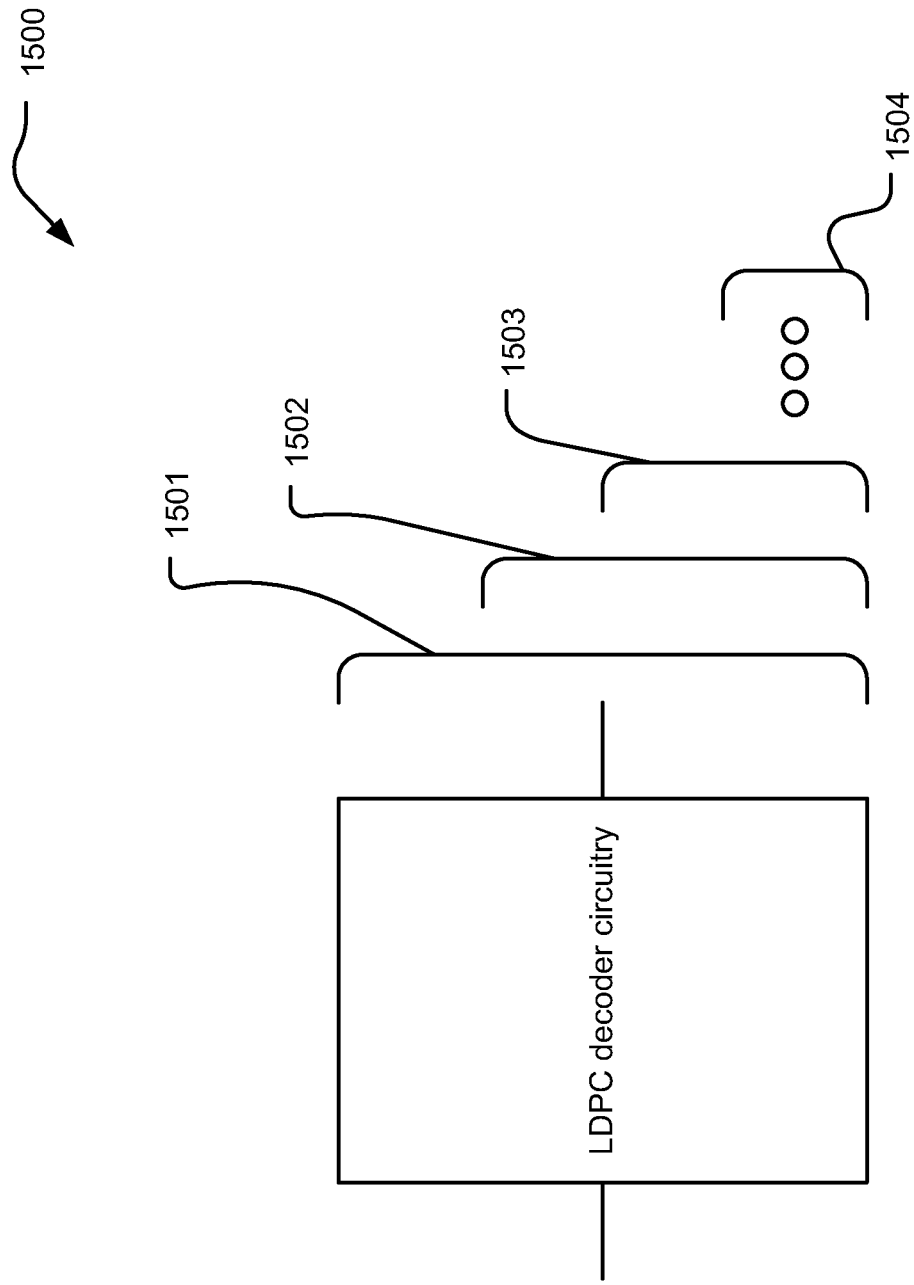
FIG. 15 illustrates an embodiment of an LDPC decoder circuitry having various circuitry subsets as employed in accordance with decoding various LDPC coded signals.

FIG. 15 illustrates an embodiment 1500 of an LDPC decoder circuitry having various circuitry subsets as employed in accordance with decoding various LDPC coded signals. This diagram shows how all of the hardware/circuitry of an LDPC decoder is employed when decoding the associated LDPC code having the lowest code rate. When decoding LDPC coded signals corresponding to the LDPC codes having lower code rates, respectively smaller portions of the hardware/circuitry of the LDPC decoder are employed.

As can be seen, the smallest subset of the hardware/circuitry of the LDPC decoder is employed when decoding the associated LDPC code having the highest code rate of all the LDPC codes. It is noted that this particular subset of hardware/circuitry is also employed when decoding each of the LDPC codes.

FIG. 16A, FIG. 16B, and FIG. 17A illustrate various embodiments of methods 1600, 1601, and 1700 for construction of various LDPC matrices from one or more base LDPC matrices.

Referring to method 1600 of FIG. 16A, the method 1600 begins by selecting first LDPC matrix (for use in decoding first LDPC coded signal(s)), as shown in a block 1610. The method 1600 continues by selectively deleting rows from the first LDPC matrix, and adding elements to remaining rows, thereby generating second LDPC matrix (for use in decoding second LDPC coded signal(s)), as shown in a block 1620. The method 1600 then operates by selectively deleting rows from the second LDPC matrix, and adding elements to remaining rows, thereby generating third LDPC matrix (for use in decoding third LDPC coded signal(s)), as shown in a block 1630.

Referring to method 1601 of FIG. 16B, the method 1601 begins by selecting first LDPC matrix (for use in decoding first LDPC coded signal(s)), as shown in a block 1611. The method 1601 then operates by selectively adding rows to the first LDPC matrix, and adding elements to those rows, and deleting elements from existing rows [of first LDPC matrix] thereby generating second LDPC matrix (for use in decoding second LDPC coded signal(s)), as shown in a block 1621. The method 1601 continues by selectively adding rows to the second LDPC matrix, and adding elements to those rows, and deleting elements from existing rows [of first/second LDPC matrix] thereby generating third LDPC matrix (for use in decoding third LDPC coded signal(s)), as shown in a block 1631.

Referring to method 1700 of FIG. 17A, the method 1700 begins by selecting first LDPC matrix (for use in decoding first LDPC coded signal(s)), as shown in a block 1710. The method 1700 continues by selectively adding rows to the first LDPC matrix, and adding elements to those rows, and deleting elements from existing rows [of first LDPC matrix] thereby generating second LDPC matrix (for use in decoding second LDPC coded signal(s)), as shown in a block 1720. The method 1700 then operates by selectively deleting rows from the first LDPC matrix, and adding elements to remaining rows, thereby generating third LDPC matrix (for use in decoding second LDPC coded signal(s)), as shown in a block 1730.

FIG. 17B illustrate an embodiment of a method 1701 for selectively employing various circuitry subsets of an LDPC decoder to effectuate decoding of various LDPC coded signals. Referring to method 1701 of FIG. 17B, the method 1701 begins by when decoding first LDPC coded signal with first associated code rate (e.g., lowest code rate), employing entirety of provisioned LDPC decoder circuitry, as shown in a block 1711. The method 1701 then operates by when decoding second LDPC coded signal with second associated code rate ($LDPC_1 < LDPC_2$), employing first subset of entirety of provisioned LDPC decoder circuitry, as shown in a block 1721. The method 1701 continues by when decoding third LDPC coded signal with third associated code rate ($LDPC_2 < LDPC_3$), employing second subset (being less than first subset) of entirety of provisioned LDPC decoder circuitry, as shown in a block 1731.

FIG. 18 illustrates an alternative embodiment 1800 of an LDPC matrix (1/2 code rate) [base LDPC matrix] from which other LDPC matrices may be constructed. This base LDPC matrix includes 8 sub-matrix rows and 16 sub-matrix columns. The sub-matrix size is 42 square (i.e., 42×42). Each sub-matrix within this LDPC matrix is a CSI sub-matrix is characterized by a shift-value, $\lambda(S)$, or an all-zero-valued sub-matrix (i.e., all elements of that respective sub-matrix being a 0).

For example, the upper left hand sub-matrix has a value of 40, and is therefore a CSI sub-matrix with a shift-value of 40, $\lambda(40)$. As also mentioned herein, a CSI sub-matrix with a shift-value of 0, $\lambda(0)$, is an identity sub-matrix. All of the sub-matrices depicted as a blank or empty sub-matrix, or with a "-" therein are all zero-valued sub-matrices.

Because the right hand side of this LDPC matrix has a lower triangular format, LDPC encoding may be performed by using this very same LDPC matrix as the generator matrix and by simply performing back-substitution to generate an LDPC codeword.

FIG. 19 illustrates an embodiment 1900 of an LDPC matrix (5/8 code rate) that is constructed from the base LDPC matrix (1/2 code rate) of FIG. 18. As can be seen, when comparing this LDPC matrix (5/8 code rate) to the previous LDPC matrix (1/2 code rate) of FIG. 18, this LDPC matrix (5/8 code rate) is formed by removing the top 2 rows of the LDPC matrix (1/2 code rate) of FIG. 18. In addition, certain sub-matrix are also modified (i.e., 4 sub-matrices in the second to top row of the LDPC matrix (5/8 code rate) are modified when compared to their original values within the base LDPC matrix (1/2 code rate) of FIG. 18.

FIG. 20 illustrates an embodiment 2000 of an LDPC matrix (2/3 code rate) that is constructed from the base LDPC matrix (1/2 code rate) of FIG. 18 or the LDPC matrix (5/8 code rate) of FIG. 19. As can be seen, when comparing this LDPC matrix (2/3 code rate) to the previous LDPC matrix (5/8 code rate) of FIG. 19, this LDPC matrix (2/3 code rate) is formed by removing the top 2 rows of the LDPC matrix (5/8 code rate) of FIG. 19. In addition, several sub-matrix are also modified in this LDPC matrix (2/3 code rate) when compared to their original values within the base LDPC matrix (1/2 code rate) of FIG. 18 or the LDPC matrix (5/8 code rate) of FIG. 19.

FIG. 21 illustrates an embodiment 2100 of an LDPC matrix (13/16 code rate) that is constructed from the base LDPC matrix (1/2 code rate) of FIG. 18, the LDPC matrix (5/8 code rate) of FIG. 19, or the LDPC matrix (2/3 code rate) of FIG. 20. As can be seen, when comparing this LDPC matrix (13/16 code rate) to the previous LDPC matrix (2/3 code rate) of FIG. 20, this LDPC matrix (13/16 code rate) is formed by removing the top row of the LDPC matrix (2/3 code rate) of FIG. 20. In addition, some sub-matrices are also modified in this LDPC matrix (13/16 code rate) when compared to their original values within the base LDPC matrix (1/2 code rate) of FIG. 18 or the LDPC matrix (2/3 code rate) of FIG. 20.

Figure 22:
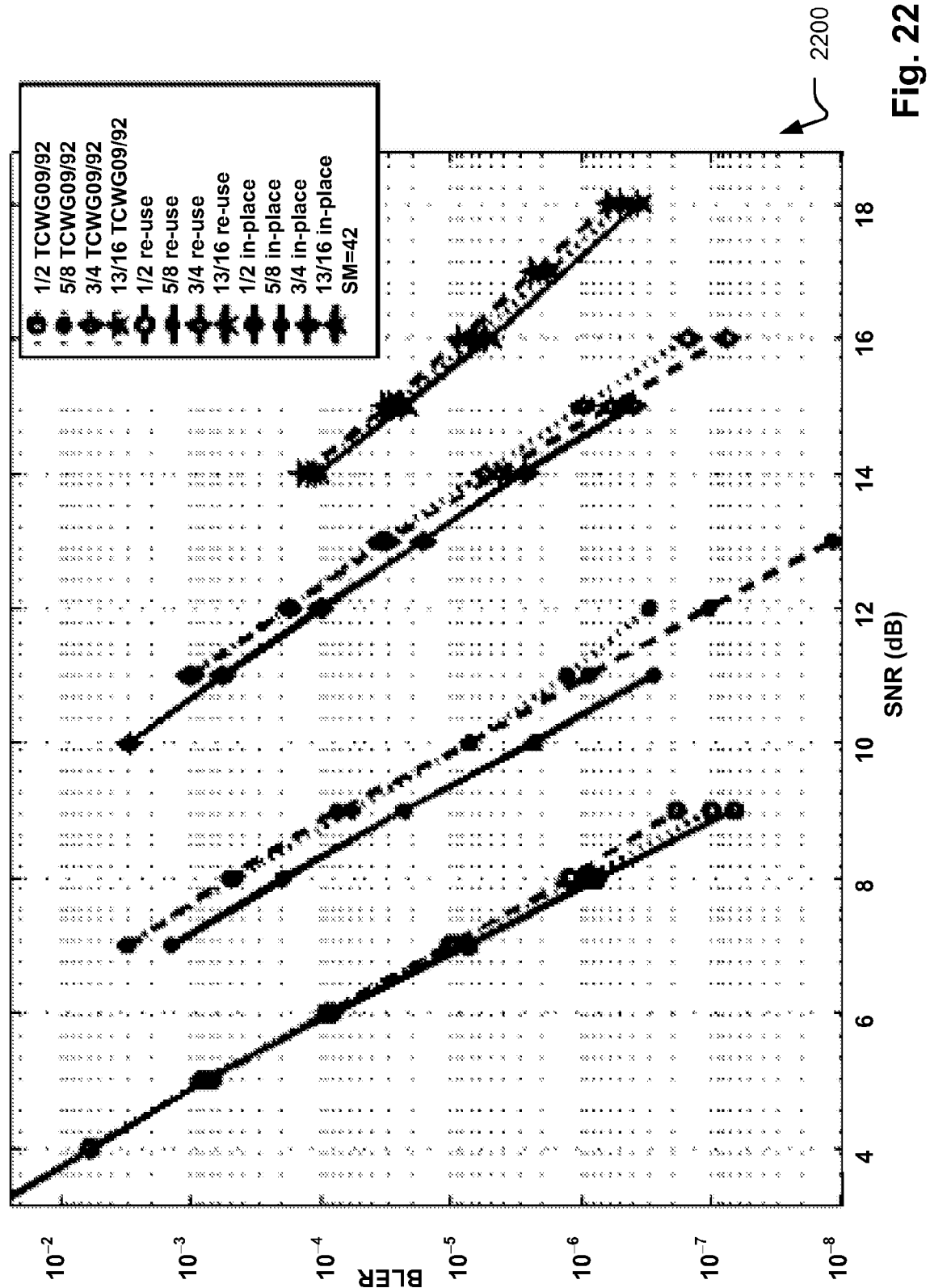
FIG. 22 illustrates an embodiment of performance comparisons of various LDPC codes (from FIGS. 18-21), having various respective code rates, using orthogonal frequency division multiplexing (OFDM) signaling with exponential decaying on a power delay profile (PDP) in accordance with quadrature phase shift keying (QPSK) modulation on Rayleigh fading communication channel.

FIG. 22 illustrates an embodiment 2200 of performance comparisons of various LDPC codes (from FIGS. 18-21), having various respective code rates, using orthogonal frequency division multiplexing (OFDM) signaling with exponential decaying on a power delay profile (PDP) in accordance with quadrature phase shift keying (QPSK) modulation on Rayleigh fading communication channel.

As can be seen in this diagram, there is relatively similar performance between LDPC codes constructed in accordance with a re-use methodology and LDPC codes constructed in accordance with an in-place methodology.

FIG. 23 illustrates an alternative embodiment 2300 of an LDPC matrix (1/2 code rate) [base LDPC matrix] from which other LDPC matrices may be constructed. This base LDPC matrix includes 8 sub-matrix rows and 16 sub-matrix columns. The sub-matrix size is 42 square (i.e., 42×42). Each sub-matrix within this LDPC matrix is a CSI sub-matrix is characterized by a shift-value, $\lambda(S)$, or an all-zero-valued sub-matrix (i.e., all elements of that respective sub-matrix being a 0).

For example, the upper left hand sub-matrix has a value of 40, and is therefore a CSI sub-matrix with a shift-value of 40, $\lambda(40)$. As also mentioned herein, a CSI sub-matrix with a shift-value of 0, $\lambda(0)$, is an identity sub-matrix. All of the sub-matrices depicted as a blank or empty sub-matrix, or with a "-" therein are all zero-valued sub-matrices.

Because the right hand side of this LDPC matrix has a lower triangular format, LDPC encoding may be performed by using this very same LDPC matrix as the generator matrix and by simply performing back-substitution to generate an LDPC codeword.

FIG. 24 illustrates an embodiment 2400 of an LDPC matrix (5/8 code rate) that is constructed from the base LDPC matrix (1/2 code rate) of FIG. 23. As can be seen, when comparing this LDPC matrix (5/8 code rate) to the previous LDPC matrix (1/2 code rate) of FIG. 23, this LDPC matrix (5/8 code rate) is formed by removing the top 2 rows of the LDPC matrix (1/2 code rate) of FIG. 23. In addition, certain sub-matrix are also modified in the top 2 rows of this LDPC matrix (5/8 code rate).

For example, 3 sub-matrices in the top row 5 of the LDPC matrix (5/8 code rate) are modified when compared to their original values within the base LDPC matrix (1/2 code rate) of FIG. 23 (i.e., 3 separate values of "-" changed to 14, 34, and 8, respectively. Also, 4 sub-matrices in the second to top row 4 of the LDPC matrix (5/8 code rate) are modified when compared to their original values within the base LDPC matrix (1/2 code rate) of FIG. 23 (i.e., a first value of "-" changed to 8, and 3 consecutive values of "-" changed to 22, 19, and 30, respectively.

FIG. 25 illustrates an embodiment 2500 of an LDPC matrix (3/4 code rate) that is constructed from the base LDPC matrix (1/2 code rate) of FIG. 23 or the LDPC matrix (5/8 code rate) of FIG. 27 [alternate LDPC matrix (5/8 code rate), also described below]. As can be seen, when comparing this LDPC matrix (5/8 code rate) to the previous LDPC matrix (1/2 code rate) of FIG. 23, this LDPC matrix (5/8 code rate) is formed by removing the top 2 rows of the LDPC matrix (5/8 code rate) of FIG. 27. In addition, some sub-matrices are also modified in this LDPC matrix (3/4 code rate) when compared to their original values within the base LDPC matrix (1/2 code rate) of FIG. 23 or the LDPC matrix (5/8 code rate) of FIG. 27.

FIG. 26 illustrates an embodiment 2600 of an LDPC matrix (5/8 code rate) that is constructed from the base LDPC matrix (1/2 code rate) of FIG. 23, the LDPC matrix (5/8 code rate) of FIG. 24, or the LDPC matrix (3/4 code rate) of FIG. 25. As can be seen, when comparing this LDPC matrix (5/8 code rate) to the previous LDPC matrix (1/2 code rate) of FIG. 23, this LDPC matrix (5/8 code rate) is formed by removing the top row of the LDPC matrix (3/4 code rate) of FIG. 25. In addition, some sub-matrices are also modified in this LDPC matrix (3/4 code rate) when compared to their original values within the base LDPC matrix (1/2 code rate) of FIG. 23 or the LDPC matrix (5/8 code rate) of FIG. 24.

FIG. 27 illustrates an alternative embodiment 2700 of an alternate LDPC matrix (5/8 code rate) that is constructed from the base LDPC matrix (1/2 code rate) of FIG. 23.

As can be seen, when comparing this LDPC matrix (5/8 code rate) to the previous LDPC matrix (1/2 code rate) of FIG. 23, this LDPC matrix (5/8 code rate) is formed by removing the top 2 rows of the LDPC matrix (1/2 code rate) of FIG. 23. In addition, certain sub-matrix are also modified in the top 2 rows of this LDPC matrix (5/8 code rate).

For example, 3 sub-matrices in the top row 5 of the LDPC matrix (5/8 code rate) are modified when compared to their original values within the base LDPC matrix (1/2 code rate) of FIG. 23 (i.e., 3 separate values of "-" changed to 34, 20, and 41, respectively. Also, 4 sub-matrices in the second to top row 4 of the LDPC matrix (5/8 code rate) are modified when compared to their original values within the base LDPC matrix (1/2 code rate) of FIG. 23 (i.e., a first value of "-" changed to 30, and 3 consecutive values of "-" changed to 14, 2, and 25, respectively.

Figure 28:
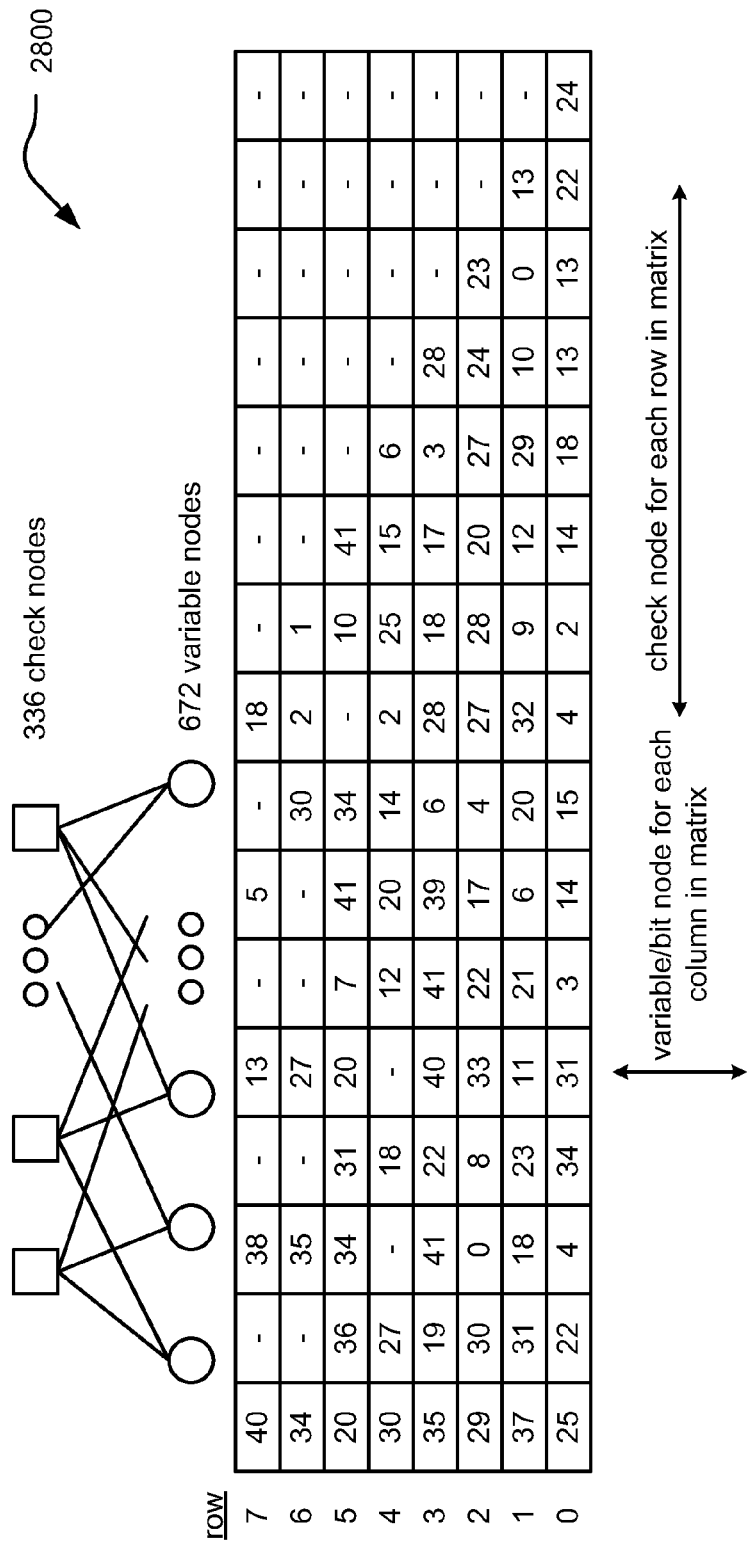
FIG. 28 illustrates an embodiment of a superimposed LDPC matrix that includes sub-matrix entries corresponding to a number of LDPC codes (e.g., of a number of LDPC codes in an in-place LDPC code set).

FIG. 28 illustrates an embodiment, depicted using reference numeral 2800, of a superimposed LDPC matrix that includes sub-matrix entries corresponding to a number of LDPC codes (e.g., of a number of LDPC codes in an in-place LDPC code set). This embodiment shows a super-imposition of a number of various LDPC codes corresponding to the various LDPC codes within an in-place LDPC code set. Again, because of the nature of in-place LDPC code construction, a significant amount of decoding and/or encoding LDPC circuitry (or functionality, etc.) may be shared across the various LDPC codes of the in-place LDPC code set.

Again, an in-place LDPC code set may be constructed with the property that higher rate codes in the set are formed by removing rows from a lower rate code in the set, and may involve adding elements to the remaining rows (e.g., changing a CSI value of a particular, remaining sub-matrix or changing an all-zero-valued sub-matrix to a CSI sub-matrix, etc.). The commonality of the characteristics of the LDPC codes within such an in-place LDPC code set supports efficient encoding and decoding using significantly shared hardware, functionality, etc. For example, certain of the various LDPC codes included within an in-place LDPC code set may be defined for use in particular applications (e.g., for the Wireless Gigabit Alliance (WGA), and/or other specification, recommended practices, etc.).

For example, an in-place LDPC code set may be constructed such that each of the multiple LDPC codes of the in-place LDPC code set employs sub-matrices of a common size, each of the LDPC codes of the in-place LDPC code set having a common block length, and the various LDPC codes of the in-place LDPC code set may each respectively have a different code rate.

Specifically, this diagram illustrates one such embodiment of an in-place LDPC code set that employs sub-matrices having a size of 42 (i.e., being square of size 42×42), each of the LDPC codes of the in-place LDPC code set having a common block length of 672 bits, and the various LDPC codes of the in-place LDPC code set respectively have code rates of rate-1/2, rate-5/8, rate-3/4, and rate-13/16.

Various approaches of performing LDPC decoding may be employed in accordance with decoding signals corresponding to the various LDPC codes of an in-place LDPC code set. For example, layer decoding such as described in reference [5] may be employed.

[5] Hocevar, D. E., "A reduced complexity decoder architecture via layered decoding of LDPC codes," *IEEE Workshop on Signal Processing Systems*, 2004, pp. 107-112.

Such a layer decoding approach operates by processing a "layer" (e.g., group of rows) of the LDPC matrix in parallel. A given decoding iteration is completed over multiple clock cycles.

For another example, a fully parallel belief propagation decoding approach such as described in reference [6] may be employed.

[6] Andrew J. Blanksby, Chris J. Howland, "A 690-mW 1-Gb/s 1024-b, rate-1/2 low-density parity-check code decoder," *IEEE Journal of Solid-State Circuits*, Vol. 37, No. 3, March 2002, pp. 404-412.

Such a fully parallel belief propagation decoding approach operates by processing all rows of the LDPC matrix in parallel. A given decoding iteration is completed during each clock cycle. Such a fully parallel belief propagation decoding approach can achieve an extremely high throughput with significant power efficiency oftentimes being better than other approaches of LDPC decoding methods (though this may be at an expense of size/area).

A fully parallel decoder architecture can be implemented to perform decoding of all of the LDPC codes of an in-place LDPC code set. This may be achieved by instantiating the entire LDPC parity check matrix in hardware. For example, a check node is implemented for each row in the LDPC matrix, and a variable/bit node for each column in the LDPC matrix. In hardware, the message wires (e.g., connectivity, circuitry, etc. to manage, transmit, and receive the check edge messages and bit edge messages in accordance with LDPC decoding) to and from the check and variable node pair corresponding to each set element in the LDPC matrix.

Generally speaking, supporting more than one LDPC code using such parallel decoder architecture is challenging, in that, it requires more than one configuration of input/output (I/O) and message wires, and multiplexers at each check/variable node input/output and additional wires. This can undesirably result in routing congestion. Consequently, the use of extra logic and an associated increase in routing congestion can result in a reduced clock frequency.

However, the characteristics of the various LDPC codes of an in-place LDPC code set allow for a very efficient use of such parallel decoder architecture in accordance with an LDPC decoder. Given the significant commonality among the various LDPC codes of the in-place LDPC code set, common hardware can be re-used extensively across the various LDPC code therein.

For example, a fully parallel LDPC decoder can be constructed based on a super-position matrix (alternatively referred to a superimposed LDPC matrix) that includes the overlay of all of the LDPC matrices corresponding to the various LDPC codes of the in-place LDPC code set. The in-place LDPC code characteristics requires no multiplexing and additional wires required to share variable and check node inputs to support the multiple LDPC codes of the in-place LDPC code set. This superimposed LDPC matrix is constructed by aligning the sub-matrices in the in-place LDPC code set starting from row 0. All of the sub-matrices are super-imposed on to one another, and the in-place LDPC code construction then ensures a single CSI value at each location (except, of course, for those locations having in which an all zero-values sub-matrix is included in all of the various LDPC codes of the in-place LDPC code set).

In accordance with decoding using a selected one of the LDPC codes, any unused check and variable nodes may be gated off. In one implementation, for a given code in the set, the unused variable node inputs may be set to 0, and un-used check node inputs may be set to (0 sign, maximum magnitude).

Considering the embodiment of an in-place LDPC code set that employs sub-matrices having a size of 42 (i.e., being square of size 42×42), each of the LDPC codes of the in-place LDPC code set having a common block length of 672 bits, and the various LDPC codes of the in-place LDPC code set respectively have code rates of rate-1/2, rate-5/8, rate-3/4, and rate-13/16, a fully parallel decoder implemented to support these various LDPC codes is approximately three (3) times smaller in size than an LDPC decoder that is based on a non-in-place LDPC code set. In other words, the commonality of the characteristics of the various LDPC codes of the in-place LDPC code set allows for significant re-use of hardware, functionality, for use decoding of signals corresponding to the various LDPC codes of the in-place LDPC code set. This provides for, among other things, a significant decrease in real estate when compared to non-in-place LDPC decoders.

Figure 29:
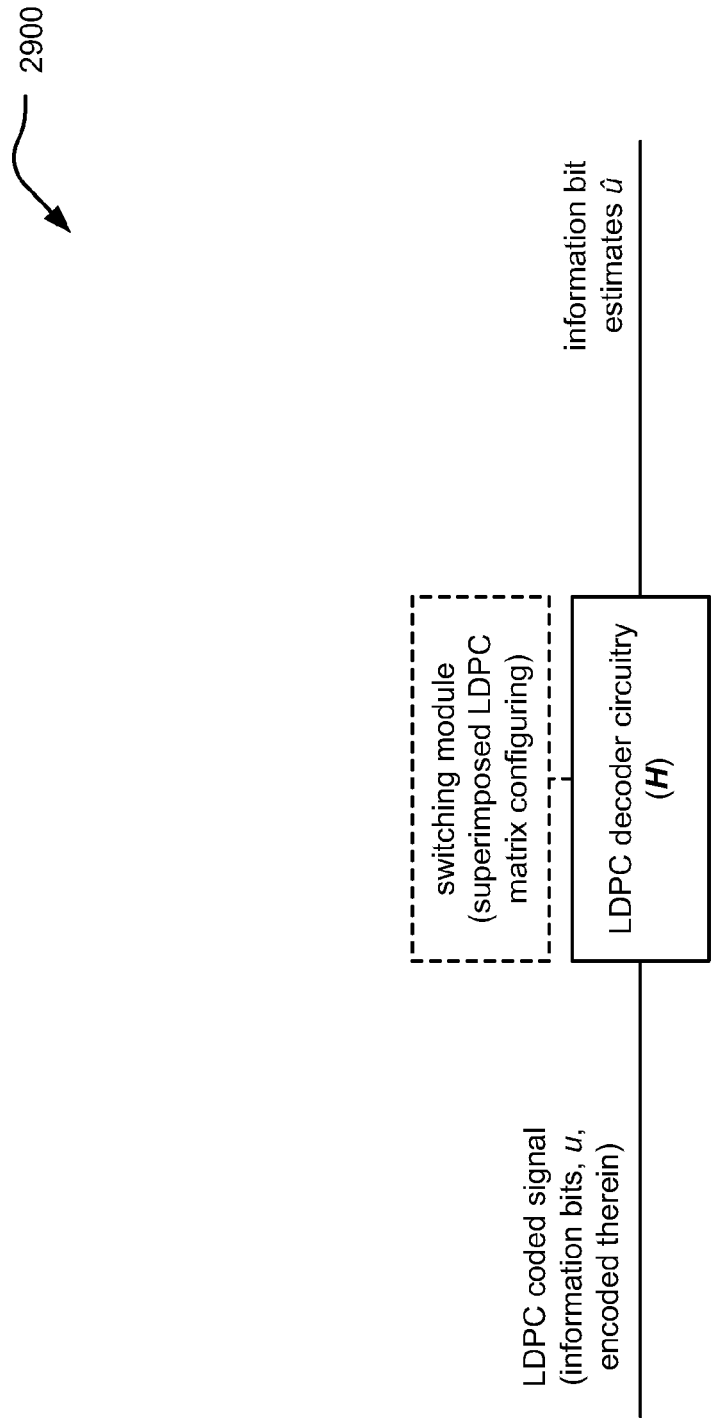
FIG. 29 illustrates embodiments of performing LDPC decoding.

FIG. 29 illustrates embodiments of performing LDPC decoding, depicted using reference numeral 2900. When employing an in-place LDPC code set, the various LDPC codes thereof have significant structural similarity. A superimposed LDPC matrix including all of the elements of the various LDPC codes of the entire in-place LDPC code set (such as within the embodiment of FIG. 28) may be implemented (e.g., in hardware). Then, depending on a selected LDPC code to be employed, a switching module may then operate by selectively enabling or disabling sub-matrices of the superimposed LDPC matrix. The switching module may then configuration the superimposed LDPC matrix within any of a number of configurations, corresponding respectively to a number of LDPC matrices of the various LDPC codes of the in-place LDPC code set.

The matrix elements that don't participate in all of the LDPC codes may be enabled/disabled using AND gates and code selection control signals. Again, such selective configuration of the various sub-matrices within a superimposed LDPC matrix may be performed using a switching module that is either implemented within or communicatively coupled to an LDPC decoder circuitry.

The LDPC decoder circuitry operates by employing any of a number of configurations of the superimposed LDPC matrix (e.g., as configured using the switching module) for respectively decoding various LDPC coded signals. Each of the LDPC coded signals may correspond to a respective LDPC code of an in-place LDPC code set.

The switching module operates by selectively enabling or disabling sub-matrices of the superimposed LDPC matrix for within each of the configurations, based on which LDPC code is selected from among or within the in-place LDPC code set.

When the superimposed LDPC matrix being within a first configuration (e.g., such as effectuated by the switching module), the LDPC decoder circuitry operates by decoding a first LDPC coded signal thereby generating first information bit estimates. Then, when the superimposed LDPC matrix being within a second configuration (e.g., such as effectuated by the switching module), the LDPC decoder circuitry operates by decoding a second LDPC coded signal thereby generating second information bit estimates.

Figure 30:
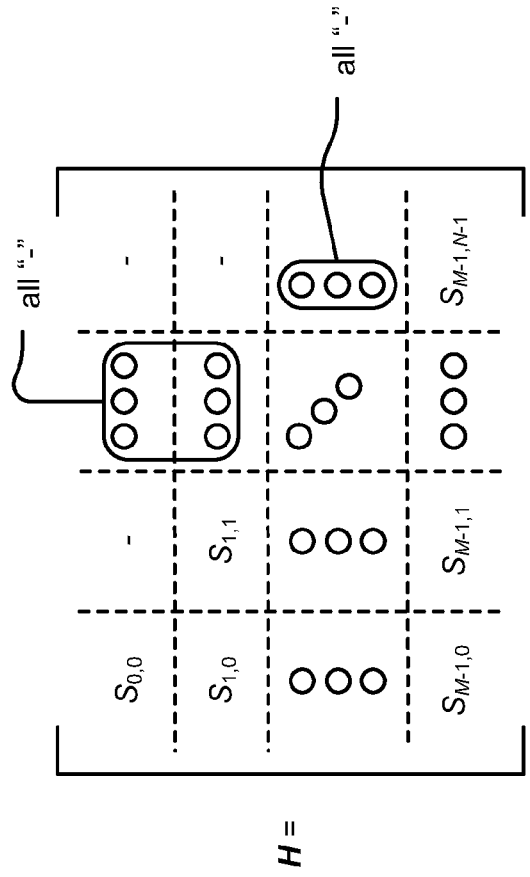
FIG. 30 illustrates an embodiment of an LDPC matrix having a lower triangular form being amenable to performing back-substitution for LDPC encoding.

FIG. 30 illustrates an embodiment of an LDPC matrix having a lower triangular form being amenable to performing back-substitution for LDPC encoding, depicted using reference numeral 3000. When an LDPC matrix has a lower triangular form (i.e., the sub-matrices of the upper-right hand side of the LDPC matrix are all-zero-valued sub-matrixes (e.g., depicted as either a blank sub-matrix or a sub-matrix having value of "-" therein.

Figure 31:
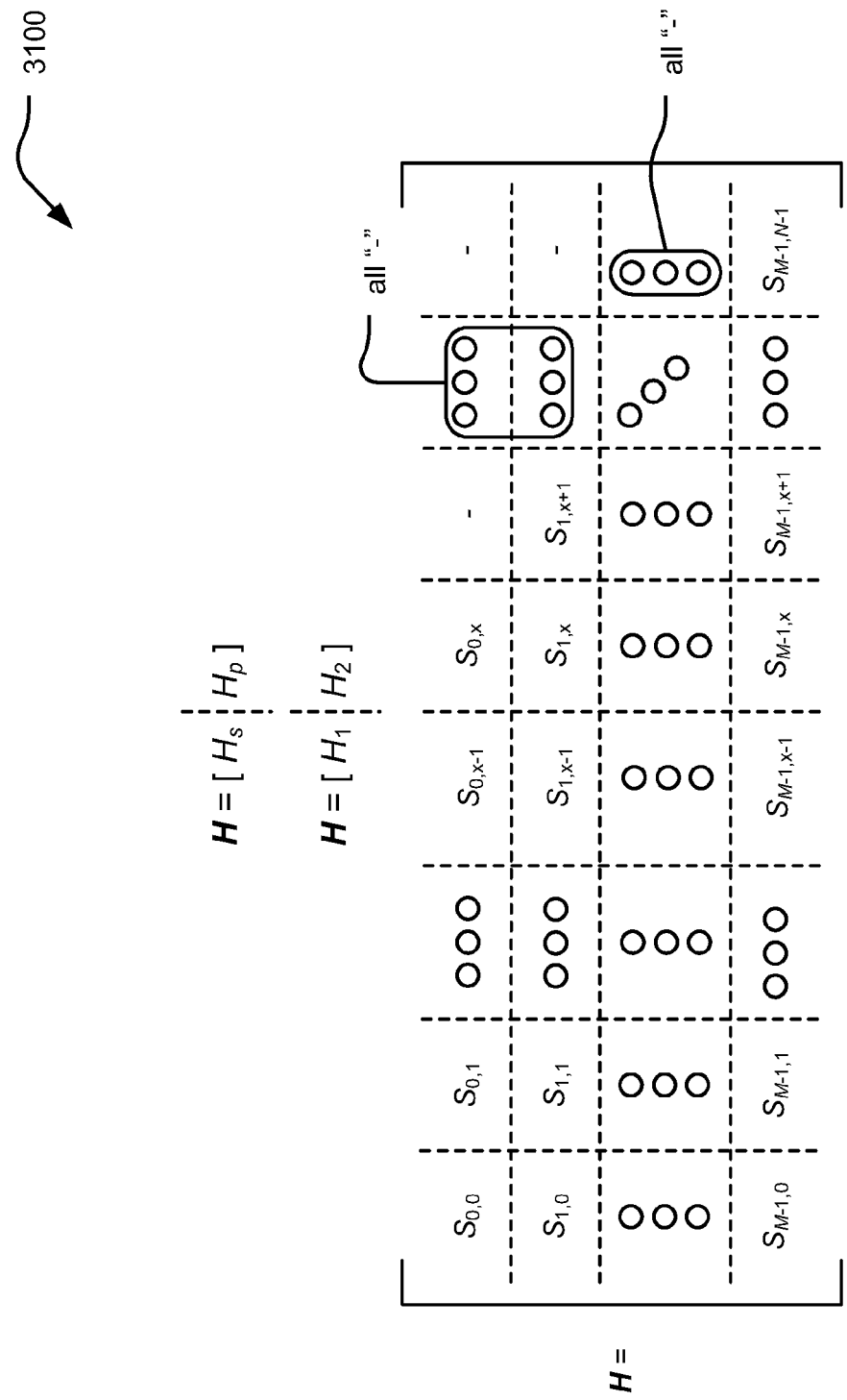
FIG. 31 illustrates an embodiment of an LDPC matrix, having a parity matrix portion being in lower triangular form, being amenable to performing back-substitution for LDPC encoding of parity bits.

FIG. 31 illustrates an embodiment of an LDPC matrix, having a parity matrix portion being in lower triangular form, being amenable to performing back-substitution for LDPC encoding of parity bits, depicted using reference numeral 3100. While the LDPC matrix of this diagram is not entirely of lower triangular form, the right hand side matrix thereof (i.e., $H_2$) is in fact of lower triangular form.

The LDPC matrix may be partitioned into a parity matrix portion (being lower triangular) and systematic matrix portions (e.g., $H_s$, $H_p$); the right hand side matrix being shown as $H_p$. In accordance with a systematic LDPC code, the systematic bits corresponding to the systematic matrix portion (e.g., $H_s$) may be generated and determined straight-forwardly. Then, because of the lower triangular form of the right hand side matrix, back-substitution may be employed for performing the LDPC encoding to generate the parity bits.

Figure 32:
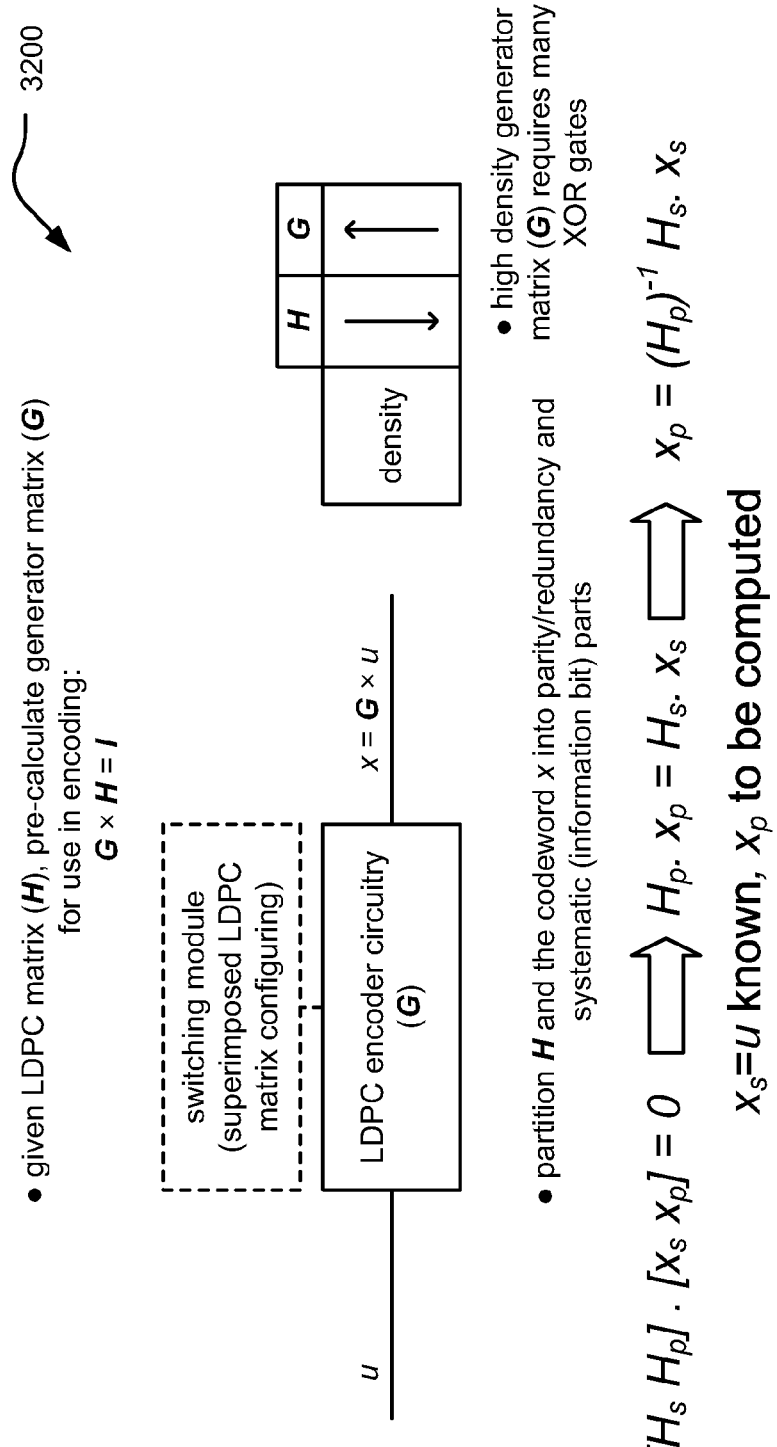
FIG. 32 illustrates embodiments of performing LDPC encoding.

FIG. 32 illustrates embodiments of performing LDPC encoding, depicted using reference numeral 3200. In accordance with LDPC encoding (e.g., encoding information bits using one of the LDPC codes of the in-place LDPC code set), a number of means may be employed.

For example, matrix multiplication may be employed by the generator matrix, G, that corresponds to the LDPC matrix, H. When given an LDPC matrix, H, the generator matrix, G, may be pre-calculated there from (i.e., G×H=I). The encoded information bits, x, may be computed from the uncoded bits u by x=G×u. However, such an approach may require a relatively large number of XOR operations because of the relationship between density of an LDPC matrix, H, and its corresponding generator matrix, G.

In addition, matrix based methods of performing LDPC encoding may be performed based on solving H×x=0 (when using a systematic LDPC code). The LDPC matrix, H, may be partitioned into a parity matrix portion (being lower triangular) (e.g., $H_p$) and a systematic matrix portion (e.g., $H_s$). The LDPC codeword, x, may likewise be partitioned into parity and systematic parts as follows:

$$[H_s H_p] \cdot [x_s x_p] = 0 \Rightarrow H_p x_p = H_s x_s \Rightarrow x_p = (H_p)^{-1} H_s x_s$$

where $x_s = u$ is known and $x_p$ is computed.

The LDPC encoding techniques describes in reference [4], cited above, operate by seeking to minimize the complexity of computing $H_p^{-1}$ for the general LDPC matrix H. If $H_p$ is of lower triangular form, then $x_p$ can be solved for using back-substitution. For a general set of LDPC codes having little or no common structure (e.g., a non-in-place LDPC code set), no parts of the LDPC encoder hardware can be shared. Stated another way, each respective LDPC code will require its own respective encoder; consequently, as the number of LDPC codes desired to be supported within a communication device increases, so will the overall size of the hardware required to supports those various LDPC codes scale.

However, the various LDPC codes of an in-place LDPC code set, having a significant degree of commonality there between, common hardware can be re-used extensively across the various LDPC code therein (for each of LDPC encoding and/or decoding). As such, a relatively small amount of size is required to support a large number of LDPC codes when those LDPC codes are included within an in-place LDPC code set.

The use of LDPC codes within an in-place LDPC code set allows for efficient encoding of the LDPC codes within a systematic, in-place LDPC code set is based on solving H×x=0. The hardware employed to compute the systematic product, $y_s = H_s \times x_s$, can be shared across all codes in the systematic, in-place LDPC code set.

If the parity matrix portion (being lower triangular) (e.g., $H_p$) of an LDPC matrix, H, has a lower triangular form (i.e., $H_p$ being lower triangular), then back-substitution hardware can also be shared across the various LDPC codes.

The matrix elements that don't participate in all of the LDPC codes may be enabled/disabled using AND gates and code selection control signals. Such selective configuration of the various sub-matrices within a superimposed LDPC matrix may be performed using a switching module that is either implemented within or communicatively coupled to an LDPC encoder circuitry. For example, a superimposed LDPC matrix including all of the elements of the various LDPC codes of the entire in-place LDPC code set (such as within the embodiment of FIG. 28) may be implemented (e.g., in hardware). Then, depending on a selected LDPC code to be employed, the switching module may then operate by selectively enabling or disabling sub-matrices of the superimposed LDPC matrix. The switching module may then configuration the superimposed LDPC matrix within any of a number of configurations, corresponding respectively to a number of LDPC matrices of the various LDPC codes of the in-place LDPC code set. Each of the LDPC matrices then has a corresponding generator matrix.

When the superimposed LDPC matrix being in a first configuration (e.g., via the switching module), the LDPC encoder circuitry employing a first corresponding generator matrix for encoding first information bits thereby generating a first LDPC coded signal. Then, when the superimposed LDPC matrix being in a second configuration (e.g., via the switching module), the LDPC encoder circuitry employing a second corresponding generator matrix for encoding second information bits thereby generating a second LDPC coded signal.

By allowing the sharing of the XOR gates across all of the LDPC codes in the in-place LDPC code set, a substantial reduction in encoder complexity may be achieved. For example, no multiplexers and additional routing is required to re-use the XOR gates employed for encoding, and no replication of XOR gates is required for separate calculations for each of the respective LDPC codes.

Figure 33:
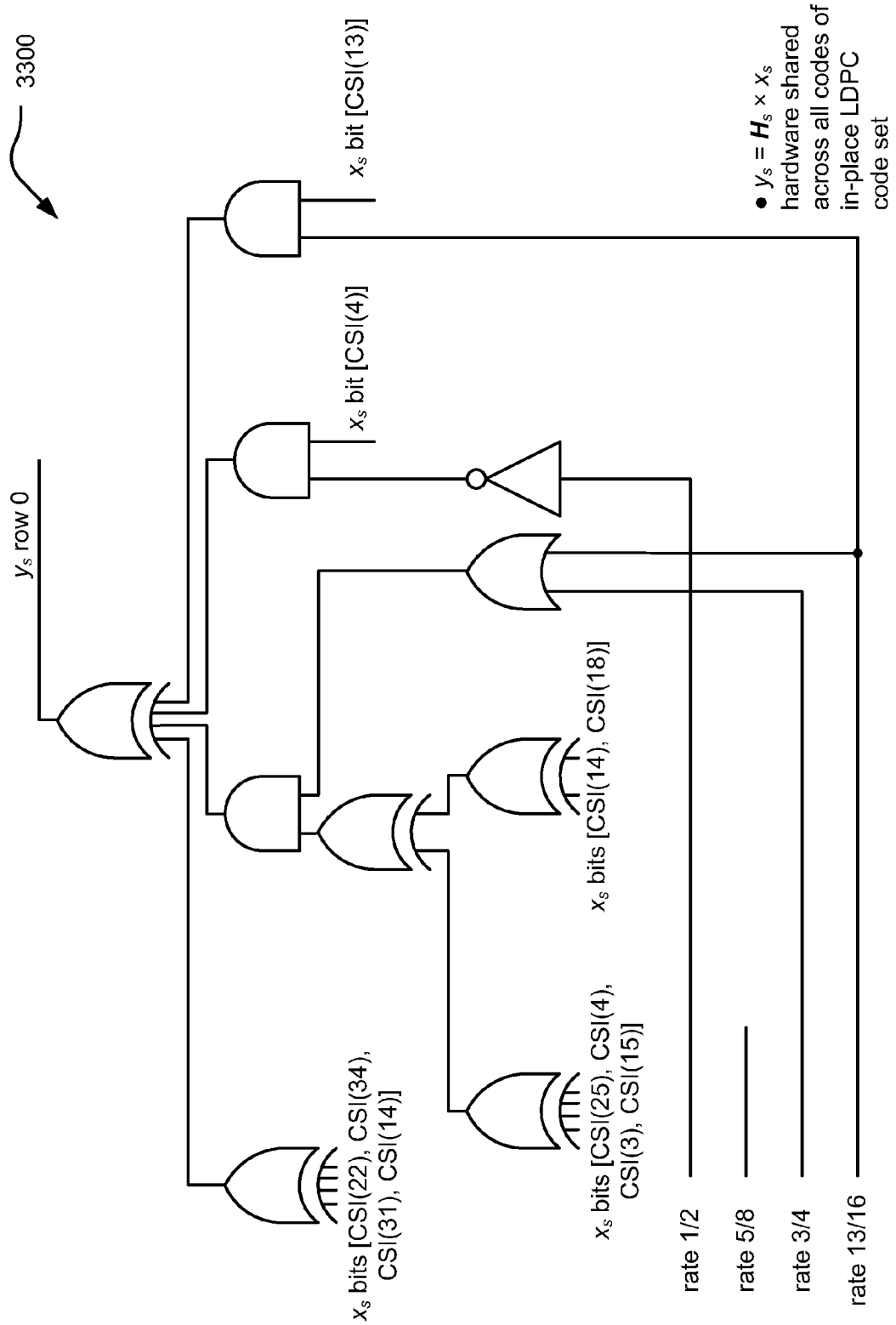
FIG. 33 illustrates an embodiment of systematic product calculation.
Figure 34:
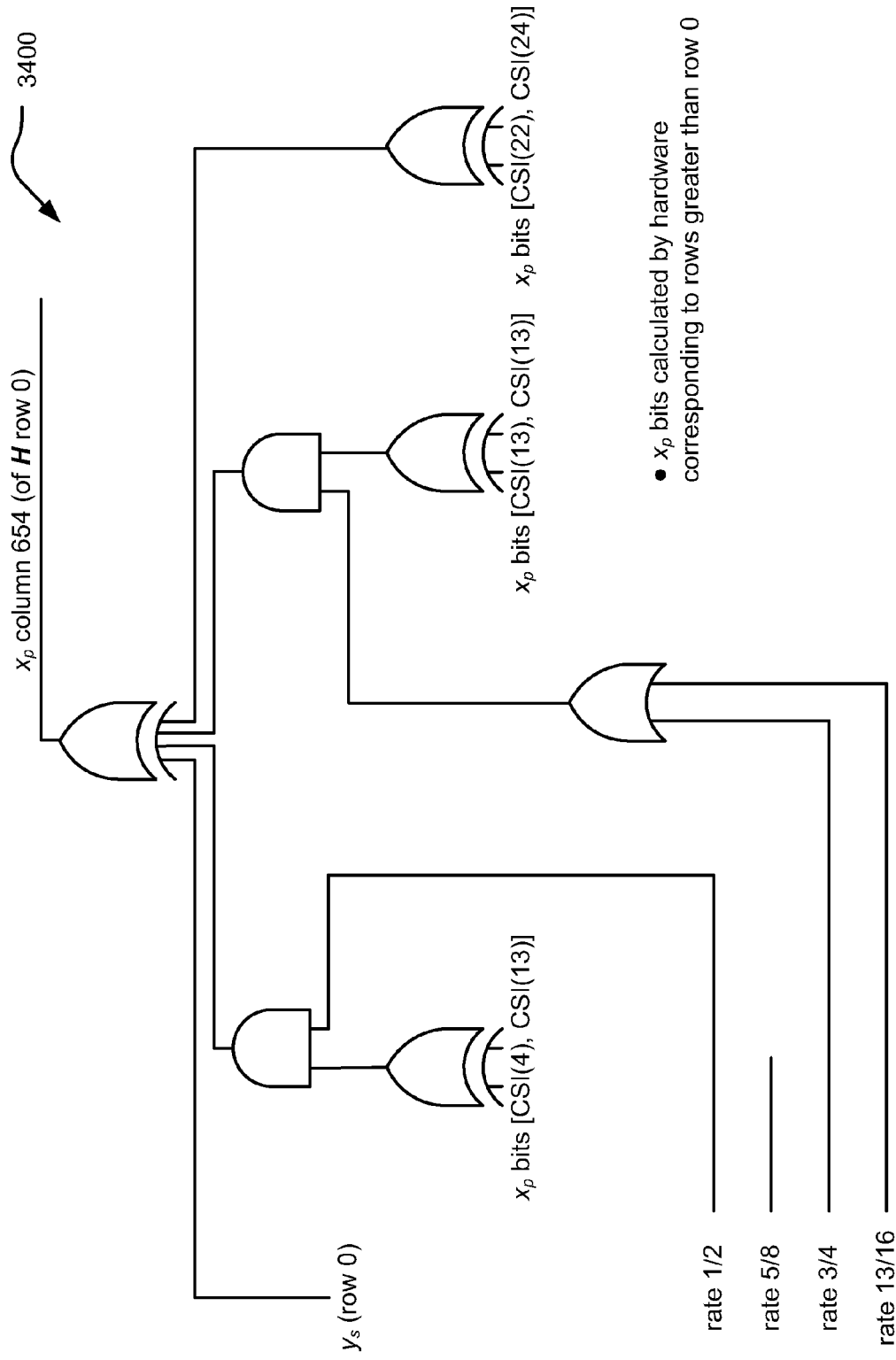
FIG. 34 illustrates an embodiment of back-substitution parity calculation.

For each of FIG. 33 and FIG. 34, these diagrams correspond to an in-place LDPC code set that employs sub-matrices having a size of 42 (i.e., being square of size 42×42), each of the LDPC codes of the in-place LDPC code set having a common block length of 672 bits, and the various LDPC codes of the in-place LDPC code set respectively have code rates of rate-1/2, rate-5/8, rate-3/4, and rate-13/16.

FIG. 33 illustrates an embodiment of systematic product calculation, depicted using reference numeral 3300. This embodiment is specific to performing systematic product calculation for a particular row of one of the in-place LDPC code set described above, though the principles herein may of course be extended to other in-place LDPC code sets without departing from the scope and spirit of the invention.

For this in-place LDPC code set, systematic product calculation for row 0 may be implemented as shown. As may be seen, because the row 0 is the same for each of the rate-1/2, rate-5/8 LDPC codes, respectively, the very same signaling is employed therein.

FIG. 34 illustrates an embodiment of back-substitution parity calculation, depicted using reference numeral 3400. This embodiment is specific to performing back-substitution parity calculation for a particular column of one of the in-place LDPC code set described above, though the principles herein may of course be extended to other in-place LDPC code sets without departing from the scope and spirit of the invention.

For this in-place LDPC code set, back-substitution parity calculation for column 654 may be implemented as shown. As may be seen, because the column 654 is the same for each of the rate-1/2, rate-5/8 LDPC codes, respectively, the very same signaling is employed therein.

Such circuitry and functionality as depicted in FIG. 33 and FIG. 34 may be implemented via a switching module that may be implemented within or communicatively coupled to a communication device (that includes an LDPC encoder circuitry).

FIG. 35A illustrates an embodiment of a method 3500 for generating an LDPC coded signal to be launched within a communication channel.

Referring to method 3500 of FIG. 35A, the method 3500 begins by selecting an LDPC code, from in-place LDPC code set, for use in encoding information bits, as shown in a block 3510. The method 3500 continues by selectively enabling or disabling connectivity to sub-matrix elements within shared LDPC encoding circuitry corresponding to the selected LDPC code, based on the selected LDPC code, as shown in a block 3520. The method 3500 then operates by employing the shared LDPC encoding circuitry, within current configuration, for encoding the information bits thereby generating LDPC codeword, as shown in a block 3530. The method 3500 continues by launching a signal, corresponding to the LDPC codeword or at least one portion thereof, into communication channel, as shown in a block 3540.

The signal being launched into the communication channel may undergo any number of processing operations to generate a signal that comports with the communication channel of interest (e.g., symbol mapping, frequency conversion, digital to analog conversion, among other types of operations, etc.).

FIG. 35B illustrates an alternative embodiment of a method 3501 for generating an LDPC coded signal to be launched within a communication channel. Referring to method 3501 of FIG. 35B, for systematic LDPC code, the method 3501 begins by partitioning LDPC parity check matrix into parity matrix portion (being lower triangular) and systematic matrix portions (e.g., $H_p$, $H_s$), as shown in a block 3511. The method 3501 then operates by employing common hardware for generating systematic LDPC codeword portion using systematic LDPC codeword portion/information bits (e.g., $u=x_s$) and systematic matrix portion (e.g., $H_s$ via $y_s=H_s \times x_s$), as shown in a block 3521.

The method 3501 continues by performing back substitution, using parity matrix portion (e.g., $H_p$), for generating parity LDPC codeword portion (e.g., $x_p$), as shown in a block 3531. The method 3501 then operates by launching a signal, corresponding to the LDPC codeword or at least one portion thereof [such as systematic LDPC codeword portion/information bits (e.g., $u=x_s$) and/or parity LDPC codeword portion (e.g., $x_p$)], into communication channel, as shown in a block 3541.

As with other embodiments, the signal being launched into the communication channel may undergo any number of processing operations to generate a signal that comports with the communication channel of interest (e.g., symbol mapping, frequency conversion, digital to analog conversion, among other types of operations, etc.).

FIG. 36A illustrates an embodiment of a method 3600 for performing decoding of LDPC signals using a superimposed LDPC matrix corresponding to an in-place LDPC code set. Referring to method 3600 of FIG. 36A, the method 3600 begins by operating an LDPC decoder circuitry for employing a plurality of configurations of a superimposed LDPC matrix for respectively decoding a plurality of LDPC coded signals, the superimposed LDPC matrix corresponding to LDPC codes of an in-place LDPC code set, as shown in a block 3610.

The method 3600 continues by selectively enabling or disabling sub-matrices of the superimposed LDPC matrix for within each of the plurality of configurations, based on a selected LDPC code of the in-place LDPC code set, as shown in a block 3620.

When the superimposed LDPC matrix being within a first of the plurality of configurations, the method 3600 then operates by operating the LDPC decoder circuitry for decoding a first of the plurality of LDPC coded signals thereby generating a first plurality of information bit estimates, as shown in a block 3630.

When the superimposed LDPC matrix being within a second of the plurality of configurations, the method 3600 continues by operating the LDPC decoder circuitry for decoding a second of the plurality of LDPC coded signals thereby generating a second plurality of information bit estimates, as shown in a block 3640.

The various LDPC coded signals being decoded may correspond to one or more signals that are received from one or more communication channels. Such signals being received from such communication channels may undergo any number of processing operations to generate a digital signal (oftentimes being a baseband signal) that may undergo LDPC decoding processing (e.g., metric generation in accordance with symbol mapping, frequency conversion, analog to digital conversion, among other types of operations, etc.).

FIG. 36B illustrates an embodiment of a method 3601 for performing encoding of LDPC signals using a superimposed LDPC matrix, and its associated generator matrices, corresponding to an in-place LDPC code set. Referring to method 3601 of FIG. 36B, the method 3601 begins by operating an LDPC encoder circuitry for employing a plurality of configurations of a superimposed LDPC matrix (and corresponding generator matrices) for respectively encoding a plurality of LDPC coded signals, the superimposed LDPC matrix corresponding to LDPC codes of an in-place LDPC code set, as shown in a block 3611.

Based on a selected LDPC code of the in-place LDPC code set, the method 3601 then operates by selectively enabling or disabling sub-matrices of the superimposed LDPC matrix for within each of the plurality of configurations, as shown in a block 3621.

When the superimposed LDPC matrix being within a first of the plurality of configurations, the method 3601 continues by operating the LDPC encoder circuitry employing a first corresponding generator matrix for encoding a first plurality of information bits thereby generating a first of the plurality of LDPC coded signals, as shown in a block 3631.

When the superimposed LDPC matrix being within a second of the plurality of configurations, the method 3601 then operates by operating the LDPC encoder circuitry employing a second corresponding generator matrix for encoding a second plurality of information bits thereby generating a second of the plurality of LDPC coded signals, as shown in a block 3641.

The various LDPC coded signals may be used to generate one or more signals that are to be launched into one or more communication channel. As with other embodiments, such signals being launched into a communication channel may undergo any number of processing operations to generate a signal that comports with the communication channel of interest (e.g., symbol mapping, frequency conversion, digital to analog conversion, among other types of operations, etc.). It is noted that the various modules and/or circuitries (e.g., encoding modules and/or circuitries, decoding modules and/or circuitries, etc.) described herein may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The operational instructions may be stored in a memory. The memory may be a single memory device or a plurality of memory devices. Such a memory device may be a read-only memory (ROM), random access memory (RAM), volatile memory, non-volatile memory, static memory, dynamic memory, flash memory, and/or any device that stores digital information. It is also noted that when the processing module implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. In such an embodiment, a memory stores, and a processing module coupled thereto executes, operational instructions corresponding to at least some of the steps and/or functions illustrated and/or described herein.

It is also noted that any of the connections or couplings between the various modules, circuits, functional blocks, components, devices, etc. within any of the various diagrams or as described herein may be differently implemented in different embodiments. For example, in one embodiment, such connections or couplings may be direct connections or direct couplings there between. In another embodiment, such connections or couplings may be indirect connections or indirect couplings there between (e.g., with one or more intervening components there between). Of course, certain other embodiments may have some combinations of such connections or couplings therein such that some of the connections or couplings are direct, while others are indirect. Different implementations may be employed for effectuating communicative coupling between modules, circuits, functional blocks, components, devices, etc. without departing from the scope and spirit of the invention.

Various aspects of the present invention have also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

Various aspects of the present invention have been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention.

One of average skill in the art will also recognize that the functional building blocks, and other illustrative blocks, modules and components herein, can be implemented as illustrated or by discrete components, application specific integrated circuits, processors executing appropriate software and the like or any combination thereof.

Moreover, although described in detail for purposes of clarity and understanding by way of the aforementioned embodiments, various aspects of the present invention are not limited to such embodiments. It will be obvious to one of average skill in the art that various changes and modifications may be practiced within the spirit and scope of the invention, as limited only by the scope of the appended claims.

What is claimed is:

1. An apparatus comprising:
an LDPC (Low Density Parity Check) decoder circuitry configured to decode:
a first LDPC coded signal based on a first LDPC code using a first LDPC matrix, based on a first configuration of a superimposed LDPC matrix, to generate a first plurality of estimates of a first plurality of information bits encoded therein; and
a second LDPC coded signal based on a second LDPC code using a second LDPC matrix, based on a second configuration of the superimposed LDPC matrix, to generate a second plurality of estimates of a second plurality of information bits encoded therein, wherein the apparatus compliant to operate based on a communication standard or recommended practice that includes a plurality of LDPC codes that includes the first LDPC code having a first code rate and the second LDPC code having a second code rate that is different than the first code rate.

2. The apparatus of claim 1, wherein:
the first LDPC code having a first plurality of sub-matrix rows; and
the second LDPC code having a second plurality of sub-matrix rows that is different than the first plurality of sub-matrix rows.

3. The apparatus of claim 1 further comprising:
a switching circuitry configured selectively to enable or disable a plurality of sub-matrices of the superimposed LDPC matrix in the first configuration to generate the first LDPC matrix and in the second configuration to generate the second LDPC matrix.

4. The apparatus of claim 1, wherein:
the superimposed LDPC matrix having a systematic matrix portion and a parity matrix portion; and
the parity matrix portion having a lower triangular form.

5. The apparatus of claim 1 further comprising:
a communication device operative within at least one of a satellite communication system, a wireless communication system, a wired communication system, and a fiber-optic communication system.

6. An apparatus comprising:
an LDPC (Low Density Parity Check) decoder circuitry configured to decode:
a first LDPC coded signal based on a first LDPC code using a first LDPC matrix, based on a first configuration of a superimposed LDPC matrix, to generate a first plurality of estimates of a first plurality of information bits encoded therein; and
a second LDPC coded signal based on a second LDPC code using a second LDPC matrix, based on a second configuration of the superimposed LDPC matrix, to generate a second plurality of estimates of a second plurality of information bits encoded therein.

7. The apparatus of claim 6 further comprising:
the LDPC decoder circuitry configured to employ any of a plurality of LDPC codes of an in-place LDPC code set, that includes the first LDPC code and the second LDPC code, using a plurality of configurations of the superimposed LDPC matrix, that includes the first configuration and the second configuration.

8. The apparatus of claim 6, wherein:
the first LDPC code having a first code rate; and
the second LDPC code having a second code rate that is different than the first code rate.

9. The apparatus of claim 6, wherein:
the first LDPC code having a first plurality of sub-matrix rows; and
the second LDPC code having a second plurality of sub-matrix rows that is different than the first plurality of sub-matrix rows.

10. The apparatus of claim 6 further comprising:
a switching circuitry selectively to enable or disable a plurality of sub-matrices of the superimposed LDPC matrix in the first configuration to generate the first LDPC matrix and in the second configuration to generate the second LDPC matrix.

11. The apparatus of claim 6 further comprising:
the apparatus compliant configured to operate based on a communication standard or recommended practice that includes a plurality of LDPC codes of an in-place LDPC code set that includes the first LDPC code and the second LDPC code.

12. The apparatus of claim 6, wherein:
the superimposed LDPC matrix having a systematic matrix portion and a parity matrix portion; and
the parity matrix portion having a lower triangular form.

13. The apparatus of claim 6 further comprising:
a communication device operative within at least one of a satellite communication system, a wireless communication system, a wired communication system, and a fiber-optic communication system.

14. A method for execution by a communication device, the method comprising:
operating at least one circuitry of the communication device to decode a first LDPC coded signal based on a first LDPC code using a first LDPC matrix, based on a first configuration of a superimposed LDPC matrix, to generate a first plurality of estimates of a first plurality of information bits encoded therein; and
operating the at least one circuitry of the communication device to decode a second LDPC coded signal based on a second LDPC code using a second LDPC matrix, based on a second configuration of the superimposed LDPC matrix, to generate a second plurality of estimates of a second plurality of information bits encoded therein.

15. The method of claim 14 further comprising:
operating the at least one circuitry of the communication device to employ any of a plurality of LDPC codes of an in-place LDPC code set, that includes the first LDPC code and the second LDPC code, using a plurality of configurations of the superimposed LDPC matrix, that includes the first configuration and the second configuration.

16. The method of claim 14, wherein:
the first LDPC code having a first code rate; and
the second LDPC code having a second code rate that is different than the first code rate.

17. The method of claim 14, wherein:
the first LDPC code having a first plurality of sub-matrix rows; and
the second LDPC code having a second plurality of sub-matrix rows that is different than the first plurality of sub-matrix rows.

18. The method of claim 14 further comprising:
operating the communication device based on a communication standard or recommended practice that includes a plurality of LDPC codes of an in-place LDPC code set that includes the first LDPC code and the second LDPC code.

19. The method of claim 14, wherein:
the superimposed LDPC matrix having a systematic matrix portion and a parity matrix portion; and
the parity matrix portion having a lower triangular form.

20. The method of claim 14, wherein the communication device is operative within at least one of a satellite communication system, a wireless communication system, a wired communication system, and a fiber-optic communication system.

* * * * *